United States Patent
Kim et al.

(10) Patent No.: US 11,646,072 B2
(45) Date of Patent: May 9, 2023

(54) ELECTRONIC DEVICE FOR ADJUSTING REFRESH OPERATION PERIOD

(71) Applicant: SK hynix Inc., Icheon-si (KR)

(72) Inventors: Hyun Seung Kim, Icheon-si (KR); Ho Uk Song, Icheon-si (KR); Tae Kyun Shin, Icheon-si (KR); Min Jun Choi, Icheon-si (KR); Duck Hwa Hong, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/480,832

(22) Filed: Sep. 21, 2021

(65) Prior Publication Data

US 2022/0406367 A1    Dec. 22, 2022

(30) Foreign Application Priority Data

Jun. 16, 2021  (KR) .................. 10-2021-0078362

(51) Int. Cl.
*G11C 7/00* (2006.01)
*G11C 11/406* (2006.01)
*G11C 11/4076* (2006.01)

(52) U.S. Cl.
CPC .... *G11C 11/40615* (2013.01); *G11C 11/4076* (2013.01)

(58) Field of Classification Search
CPC .............................. G11C 11/40615
USPC ................................. 365/222
See application file for complete search history.

(56) References Cited

U.S. PATENT DOCUMENTS 10,360,968 B2    7/2019   Ishikawa
2012/0127817 A1*  5/2012   Fujishiro ........... G11C 11/40615
                                                    365/222

FOREIGN PATENT DOCUMENTS

KR        102088343 B1    3/2020

* cited by examiner

*Primary Examiner* — Hoai V Ho
(74) *Attorney, Agent, or Firm* — William Park & Associates Ltd.

(57) ABSTRACT

An electronic device includes an intelligent refresh control circuit generating an intelligent refresh pulse with a pulse that has a generation period that is adjusted based on the number of generations of an auto refresh signal during an intelligent refresh operation, and an internal refresh signal generation circuit outputting one of a self-refresh pulse including a pulse that is periodically generated by an enable signal during a self-refresh operation and the intelligent refresh pulse as an internal refresh signal.

27 Claims, 26 Drawing Sheets

ELECTRONIC DEVICE FOR ADJUSTING REFRESH OPERATION PERIOD

CROSS-REFERENCE TO RELATED APPLICATIONS

The present application claims priority under 35 U.S.C. 119(a) to Korean Patent Application No. 10-2021-0078362, filed on Jun. 16, 2021, which is incorporated herein by reference in its entirety.

BACKGROUND

1. Technical Field

Embodiments of the present disclosure relate to electronic devices for adjusting a refresh operation period.

2. Related Art

A semiconductor device includes a plurality of cell arrays for storing data, and each of the plurality of cell arrays includes a plurality of cells. Each of the cells includes a cell capacitor and a cell transistor. The semiconductor device stores data through an operation of charging or discharging electric charges in or from the cell capacitor, and the amount of electric charge stored in the cell capacitor should ideally always be constant. However, in reality, the amount of electric charge stored in the cell capacitor is changed due to a voltage difference with the peripheral circuit. Electric charge may flow out while the cell capacitor is charged, or may flow in when the cell capacitor is discharged. As such, the change in the amount of charge of the cell capacitor means that the data that is stored in the cell capacitor is changed, which means that the stored data is lost. The semiconductor device performs a refresh operation to prevent data loss as described above.

SUMMARY

According to an embodiment of the present invention, there is provided an electronic device with an intelligent refresh control circuit configured to generate an intelligent refresh pulse with a pulse that has a generation period that is adjusted based on the number of generations of an auto refresh signal during an intelligent refresh operation, and an internal refresh signal generation circuit configured to output one of a self-refresh pulse including a pulse that is periodically generated by an enable signal during a self-refresh operation and the intelligent refresh pulse as an internal refresh signal.

In addition, according to another embodiment of the present invention, there is provided an electronic device with a self-refresh control circuit configured to generate a self-refresh pulse with a pulse that is periodically generated by a self-refresh entry signal and a self-refresh end signal during a self-refresh operation, an intelligent refresh control circuit configured to generate an intelligent refresh pulse with a pulse that has a generation period that is adjusted based on the number of generations of an auto refresh signal during an intelligent refresh operation, and an internal refresh signal generation circuit configured to output one of the self-refresh pulse and the intelligent refresh pulse as an internal refresh signal based on an enable signal.

DETAILED DESCRIPTION OF THE EMBODIMENTS

In the following description of embodiments, when a parameter is referred to as being "predetermined," it may be intended to mean that a value of the parameter is determined in advance when the parameter is used in a process or an algorithm. The value of the parameter may be set when the process or the algorithm starts or may be set during a period that the process or the algorithm is executed.

It will be understood that although the terms "first," "second," "third," etc. are used herein to describe various elements, these elements should not be limited by these terms. These terms are only used to distinguish one element from another element and are not intended to imply an order or number of elements. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal with a logic "high" level may be distinguished from a signal with a logic "low" level. For example, when a signal with a first voltage correspond to a signal with a logic "high" level, a signal with a second voltage correspond to a signal with a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal with a logic "high" level in one embodiment may be set to have a logic "low" level in another embodiment.

Various embodiments of the present disclosure will be described hereinafter in detail with reference to the accompanying drawings. However, the embodiments described herein are for illustrative purposes only and are not intended to limit the scope of the present disclosure.

Figure 1:
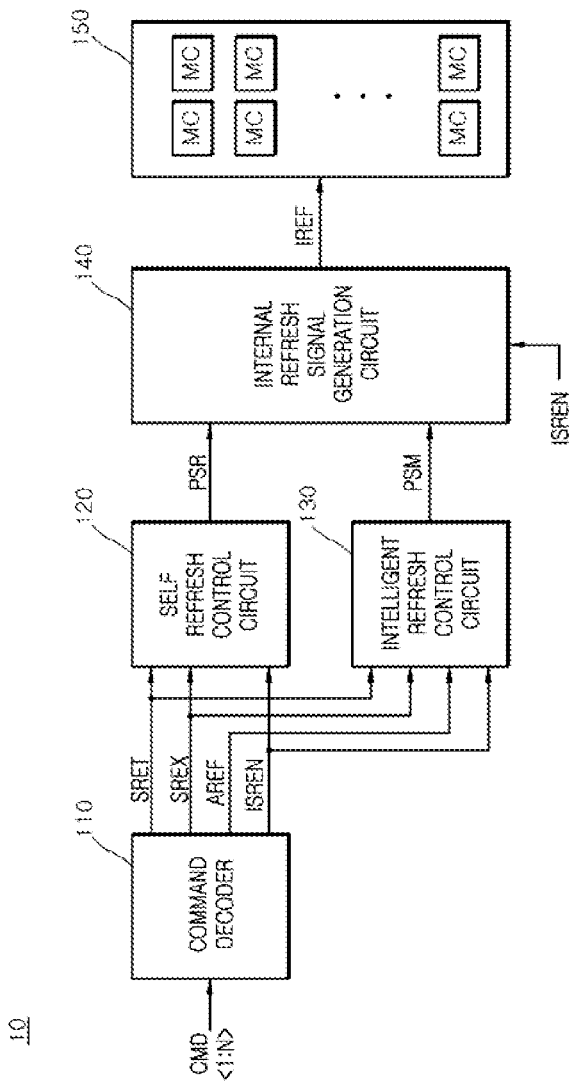
FIG. 1 is a block diagram illustrating a configuration of an electronic device according to an embodiment of the present disclosure.

FIG. 1 is a block diagram illustrating a configuration of an electronic device 10 according to an embodiment of the present disclosure. As illustrated in FIG. 1, the electronic device 10 according to an embodiment of the present disclosure may include a command decoder 110, a self-refresh control circuit 120, an intelligent refresh control circuit 130, an internal refresh signal generation circuit 140, and a memory region 150.

The command decoder 110 may receive commands CMD<1:N> from an external device (e.g., controller). The command decoder 110 may decode the commands CMD<1:N> to generate a self-refresh entry signal SRET, a self-refresh end signal SREX, an auto refresh signal AREF, and an enable signal ISREN. The command decoder 110 may generate the self-refresh end signal SREX after generating the self-refresh entry signal SRET when the logic level combination of the commands CMD<1:N> is a logic level combination for performing a self-refresh operation and an intelligent refresh operation. The command decoder 110 may generate the auto refresh signal AREF when the logic level combination of the commands CMD<1:N> is a logic level combination for performing the auto refresh operation. The command decoder 110 may generate the enable signal ISREN when the logic level combination of the commands CMD<1:N> is a logic level combination for performing the intelligent refresh operation. The logic level combination and the number of bits of the commands CMD<1:N> for performing the self-refresh operation and the intelligent refresh operation may be variously set according to embodiments. The self-refresh operation may be set as a refresh operation that is performed periodically to prevent loss of data that is stored in the memory region 150. The intelligent refresh operation may be set as a refresh operation that adjusts the self-refresh period based on the number of auto-refresh operations.

The self-refresh control circuit 120 may receive the self-refresh entry signal SRET, the self-refresh end signal SREX, and the enable signal ISREN from the command decoder 110. The self-refresh control circuit 120 may generate a self-refresh pulse PSR with a pulse that is periodically generated based on the self-refresh entry signal SRET and the self-refresh end signal SREX when the enable signal ISREN is disabled. The self-refresh control circuit 120 may generate the self-refresh pulse PSR with a pulse that is periodically generated from a time point at which the self-refresh entry signal SRET is input to a time point at which the self-refresh end signal SREX is input.

The intelligent refresh control circuit 130 may receive the self-refresh entry signal SRET, the self-refresh end signal SREX, the auto refresh signal AREF, and the enable signal ISREN from the command decoder 110. The intelligent refresh control circuit 130 may generate an intelligent refresh pulse PSM with a pulse that has a generation period that is adjusted based on the self-refresh entry signal SRET, the self-refresh end signal SREX, the auto refresh signal AREF, and the enable signal ISREN during an intelligent refresh operation. The intelligent refresh control circuit 130 may generate the intelligent refresh pulse PSM with a pulse that has a generation period that is adjusted based on the number of generations of the auto refresh signal AREF during the intelligent refresh operation.

The internal refresh signal generation circuit 140 may receive the enable signal ISREN from the command decoder 110. The internal refresh signal generation circuit 140 may receive the self-refresh pulse PSR from the self-refresh control circuit 120. The internal refresh signal generation circuit 140 may receive the intelligent refresh pulse PSM from the intelligent refresh control circuit 140. The internal refresh signal generation circuit 140 may output one of the self-refresh pulse PSR and the intelligent refresh pulse PSM based on a logic level of the enable signal ISREN. The internal refresh signal generation circuit 140 may output the self-refresh pulse PSR as an internal refresh signal IREF by the enable signal ISREN that is disabled during the self-refresh operation. The internal refresh signal generation circuit 140 may output the intelligent refresh pulse PSM as the internal refresh signal IREF by the enable signal ISREN that is enabled during the intelligent refresh operation.

The memory region 150 may receive the internal refresh signal IREF from the internal refresh signal generation circuit 140. The memory region 150 may include a plurality of memory cells MC. The memory cells MC of the memory region 150 may perform a refresh operation based on a pulse of the internal refresh signal IREF.

Figure 2:
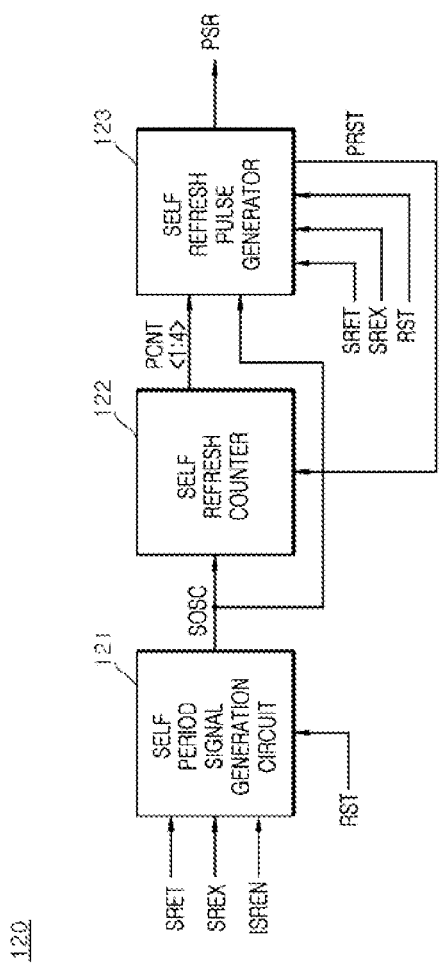
FIG. 2 is a block diagram illustrating a configuration of a self-refresh control circuit included in the electronic device that is illustrated in FIG. 1.

FIG. 2 is a block diagram according to an embodiment of the self-refresh control circuit 120 that is illustrated in FIG. 1. As illustrated in FIG. 2, the self-refresh control circuit 120 may include a self-period signal generation circuit 121, a self-refresh counter 122, and a self-refresh pulse generator 123.

The self-period signal generation circuit 121 may generate a self-period signal SOSC with a pulse that is periodically generated from a time point at which the enable signal ISREN is disabled and the self-refresh entry signal SRET is input to a time point at which the self-refresh end signal SREX is input. The self-period signal generation circuit 121 may generate the self-period signal SOSC that is disabled by a reset signal RST. The reset signal RST may be set as a signal that is enabled to a logic "high" level during a power-up period or an initialization operation in which the electronic device 10 starts to perform an operation.

The self-refresh counter 122 may generate first to fourth self-counting signals PCNT<1:4> that are counted by the pulse of the self-period signal SOSC. The self-refresh counter 122 may generate the first to fourth self-counting signals PCNT<1:4> that are sequentially up-counted when the pulse of the self-period signal SOSC is input. The self-refresh counter 122 may generate the first to fourth self-counting signals PCNT<1:4> that are initialized by a self-reset signal PRST. The self-refresh counter 122 may generate the first to fourth self-counting signals PCNT<1:4> in which all bits are initialized to a logic "low" level when the self-reset signal PRST is enabled.

The self-refresh pulse generator 123 may generate the self-refresh pulse PSR from the self-period signal SOSC based on the refresh entry signal SRET and the first to fourth self-counting signals PCNT<1:4>. The self-refresh pulse generator 123 may generate the self-reset signal PRST based on the reset signal RST, the self-refresh end signal SREX, and the self-refresh pulse PSR.

Figure 3:
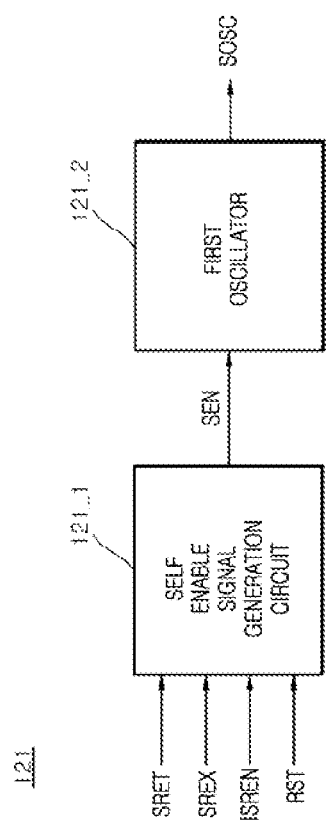
FIG. 3 is a block diagram illustrating a configuration of a self-period signal generation circuit included in the self-refresh control circuit that is illustrated in FIG. 2.

FIG. 3 is a block diagram according to an embodiment of the self-period signal generation circuit 121 that is illustrated in FIG. 2. As illustrated in FIG. 3, the self-period signal generation circuit 121 may include a self-enable signal generation circuit 121_1 and a first oscillator 121_2.

The self-enable signal generation circuit 121_1 may generate a self-enable signal SEN that is enabled from a time point at which the enable signal ISREN is disabled and the self-refresh entry signal SRET is input to a time point at which the self-refresh end signal SREX is input. The self-enable signal generation circuit 1211 may generate the self-enable signal SEN that is disabled by the reset signal RST.

The first oscillator 121_2 may generate the self-period signal SOSC with a pulse that is periodically generated during a period in which the self-enable signal SEN is enabled.

Figure 4:
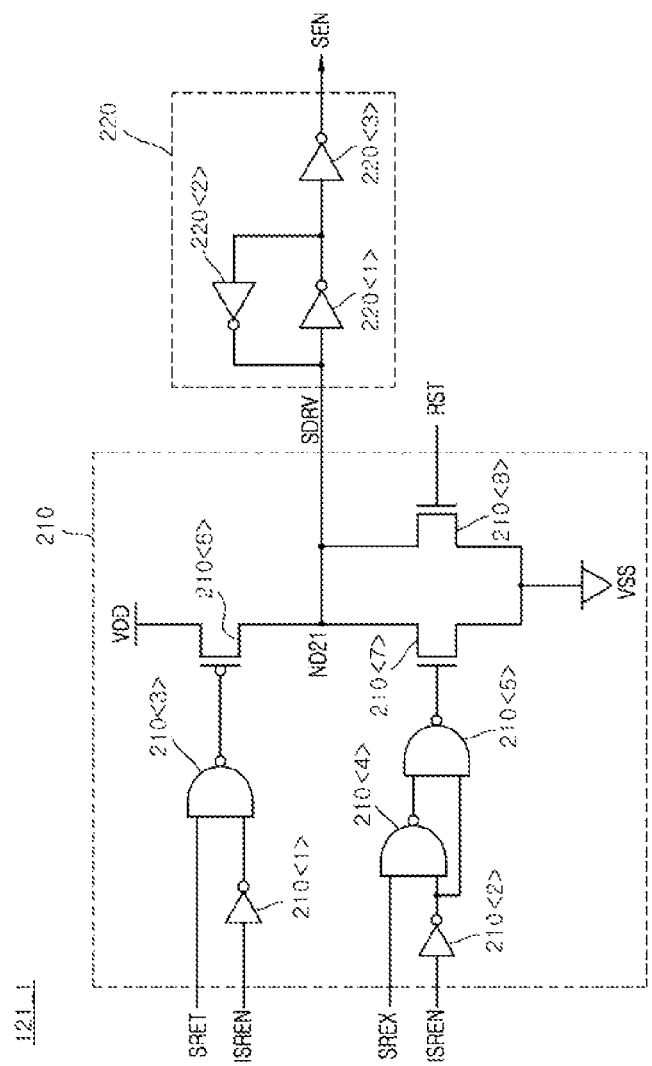
FIG. 4 is a circuit diagram illustrating a configuration of a self-enable signal generation circuit included in the self-period signal generation circuit that is illustrated in FIG. 3.

FIG. 4 is a circuit diagram according to an embodiment of the self-enable signal generation circuit 121_1 that is illustrated in FIG. 3. As illustrated in FIG. 4, the self-enable signal generation circuit 121_1 may include a self-drive signal generation circuit 210 and a first latch circuit 220.

The self-drive signal generation circuit 210 may be implemented with inverters 210<1> and 210<2>, NAND gates 210<3>, 210<4>, and 210<5>, a PMOS transistor 210<6>, and NMOS transistors 210<7> and 210<8>. The self-drive signal generation circuit 210 may drive a node ND21 to a power voltage VDD level to generate a self-drive signal SDRV at a logic "high" level when an enable signal ISREN is disabled at a logic "low" level and a self-refresh entry signal SRET is input at a logic "high" level. The self-drive signal generation circuit 210 may drive the node ND21 to a ground voltage VSS level to generate a self-drive signal SDRV at a logic "low" level when the enable signal ISREN is disabled at a logic "low" level and a self-refresh end signal SREX is input at a logic "high" level. The self-drive signal generation circuit 210 may drive the node ND21 to a ground voltage VSS level to generate a self-drive signal SDRV at a logic "low" level when a reset signal RST is enabled at a logic "high" level.

The first latch circuit 220 may be implemented with inverters 220<1>, 220<2>, and 220<3>. The first latch circuit 220 may latch the self-drive signal SDRV and buffer the latched self-drive signal SDRV to generate a self-enable signal SEN.

Figure 5:
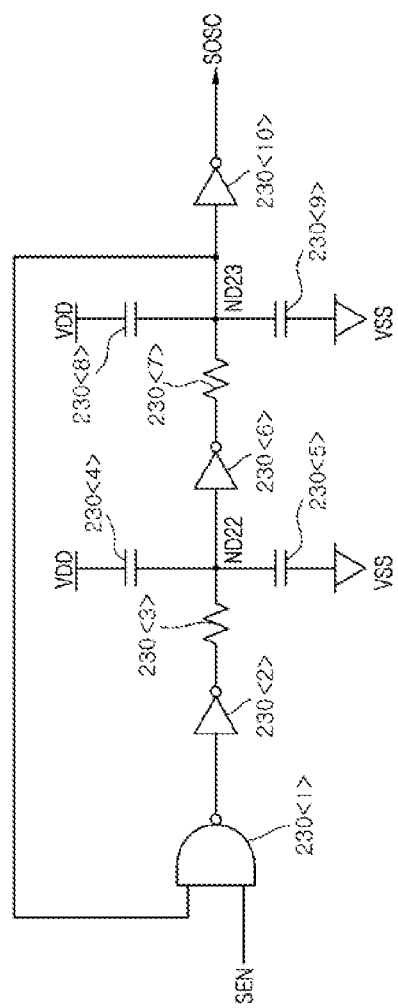
FIG. 5 is a circuit diagram illustrating a configuration of a first oscillator included in the self-period signal generation circuit that is illustrated in FIG. 3.

FIG. 5 is a circuit diagram according to an embodiment of the first oscillator 121_2 that is illustrated in FIG. 3. As illustrated in FIG. 5, the first oscillator 121_2 may be implemented with a NAND gate 230<1>, inverters 230<2>, 230<6>, and 230<10>, resistors 230<3> and 230<7>, and capacitors 230<4>, 230<5>, 230<8> and 230<9>.

The NAND gate 230<1>, the inverter 230<2>, and the resistor 230<3> may be connected in series between a node ND23 and a node ND22. The capacitor 230<4> may be connected between a power voltage VDD and the node ND22. The capacitor 230<5> may be connected between the node ND22 and a ground voltage VSS. The NAND gate 230<1> may act as an inverter when the self-enable signal SEN is input at a logic "high" level.

The inverter 230<6> and the resistor 230<7> may be connected in series between the node ND22 and the node ND23. The capacitor 230<8> may be connected between the power voltage VDD and the node ND23. The capacitor 230<9> may be connected between the node ND23 and the ground voltage VSS.

The inverter 230<10> may inversely buffer a signal of the node ND23 to generate a self-period signal SOSC.

The first oscillator 121_2 may generate the self-period signal SOSC with a pulse that is periodically generated when the self-enable signal SEN is input at a logic "high" level.

Figure 6:
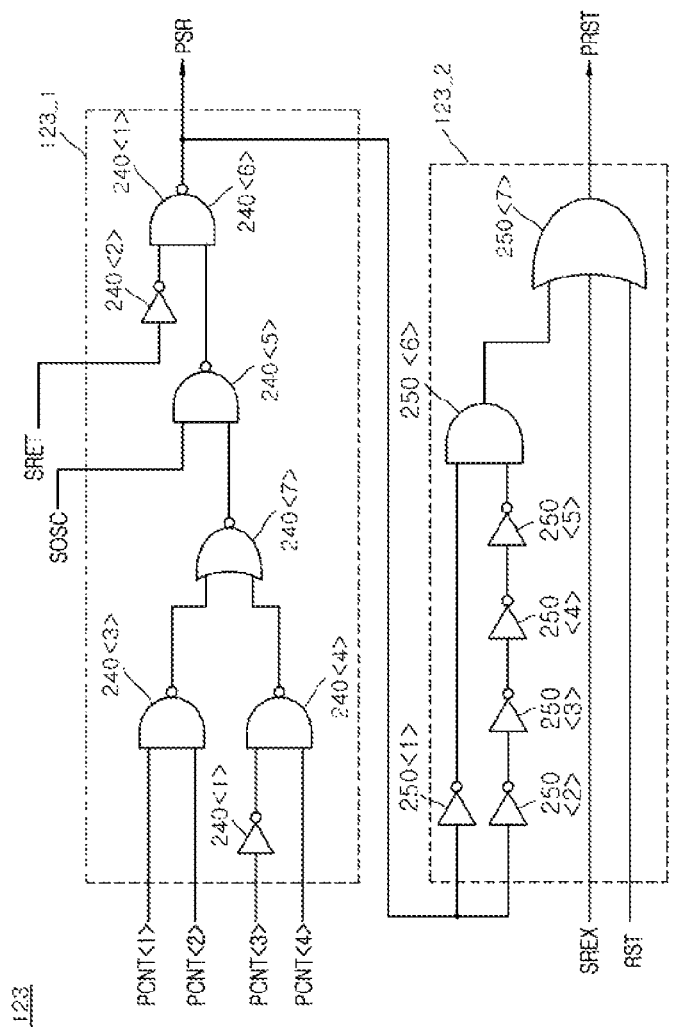
FIG. 6 is a circuit diagram illustrating a configuration of a self-refresh pulse generator included in the self-refresh control circuit that is illustrated in FIG. 2.

FIG. 6 is a circuit diagram according to an embodiment of the self-refresh pulse generator 123 that is illustrated in FIG. 2. As illustrated in FIG. 6, the self-refresh pulse generator 123 may include a self-period signal transmission circuit 123_1 and a self-reset signal generation circuit 123_2.

The self-period signal transmission circuit 123_1 may be implemented with inverters 240<1> and 240<2>, NAND gates 240<3>, 240<4>, 240<5>, and 240<6>, and a NOR gate 240<7>. The self-period signal transmission circuit 123_1 may generate a self-refresh pulse PSR from the self-period signal SOSC when the self-refresh entry signal SRET is disabled at a logic "low" level and first to fourth self-counting signals PCNT<1:4> are counted as a first logic level combination. The first logic level combination of the first to fourth self-counting signals PCNT<1:4> may refer to a case in which the first self-counting signal PCNT<1> is counted as a logic "high" level, the second self-counting signal PCNT<2> is counted as a logic "high" level, the third self-counting signal PCNT<3> is counted as a logic "low" level, and the fourth self-counting signal PCNT<4> is counted as a logic "high" level.

The self-reset signal generation circuit 123_2 may be implemented with inverters 250<1>, 250<2>, 250<3>, 250<4>, and 250<5>, an AND gate 250<6>, and an OR gate 250<7>. The self-reset signal generation circuit 123_2 may generate a self-reset signal PRST with a pulse that is generated when the self-refresh pulse PSR is input at a logic "high" level. The self-reset signal generation circuit 123_2 may generate the self-reset signal PRST that is enabled at a logic "high" level when one of a self-refresh end signal SREX and a reset signal RST is input at a logic "high" level. The self-reset signal generation circuit 123_2 may generate a self-reset signal PRST with a pulse that is generated when the self-refresh signal PSR transitions from a logic "high" level to a logic "low" level. The self-reset signal generation circuit 123_2 may generate a self-reset signal PRST with a pulse width that corresponds to a delay time of the inverters 250<2>, 250<3>, 250<4>, and 250<5>.

Figure 7:
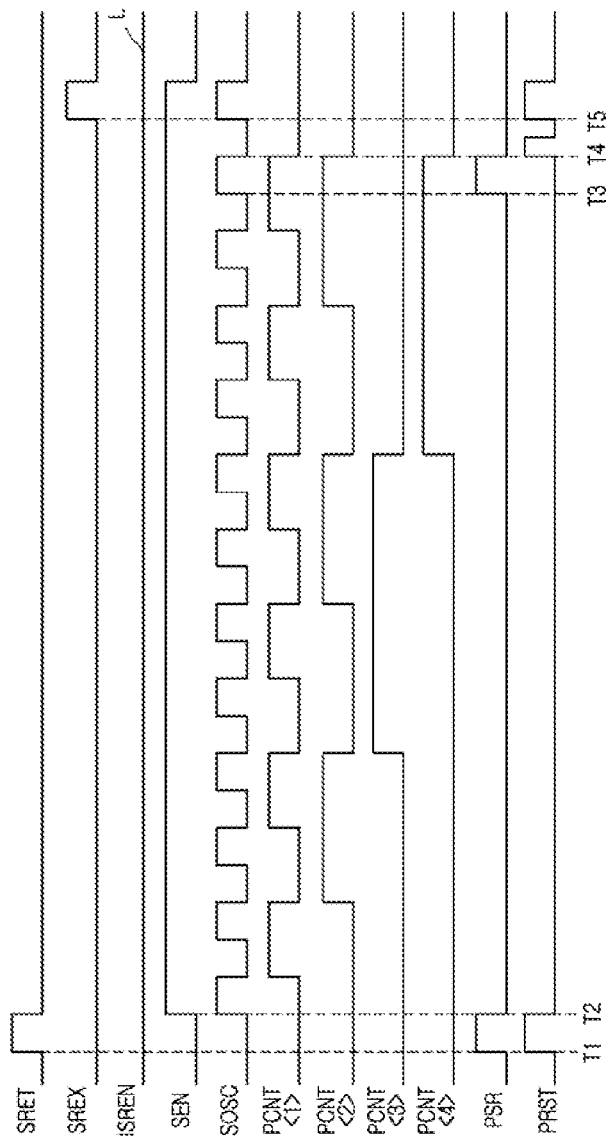
FIG. 7 is a timing diagram illustrating a self-refresh operation of an electronic device according to an embodiment of the present disclosure.

FIG. 7 is a timing diagram illustrating a self-refresh operation of an electronic device 10 according to an embodiment of the present disclosure. The self-refresh operation of the electronic device 10 according to an embodiment of the present disclosure will be described with reference to FIG. 7.

At time T1, the command decoder 110 may decode the commands CMD<1:N>, which are logic level combinations to perform the self-refresh operation, to generate a self-refresh entry signal SRET at a logic "high" level. The command decoder 110 may decode the commands CMD<1:N>, which are logic level combinations to perform the self-refresh operation, to generate an enable signal ISREN at a logic "low" level.

The self-refresh pulse generator 123 may generate a self-reset signal PRST at a logic "high" level by the refresh entry signal SRET at a logic "high" level.

The internal refresh signal generation circuit 140 may output the self-refresh pulse PSR as an internal refresh signal IREF by the enable signal ISREN at a logic "low" level.

The memory cells MC of the memory region 150 may be refreshed by a pulse of the internal refresh signal IREF.

At time point T2, the self-refresh counter 122 may generate first to fourth self-counting signals PCNT<1:4> in which all bits are initialized at a logic "low" level by a self-reset signal PRST at a logic "high" level at the time T2.

In the self-enable signal generation circuit 121_1 of the self-period signal generation circuit 121, the enable signal ISREN may be disabled at a logic "low" level, and the self-refresh entry signal SRET at the time T1 may be input at a logic "high" level, so that the self-enable signal SEN at a logic "high" level may be generated.

The first oscillator 121_2 may receive the self-enable signal SEN at a logic "high" level to generate a self-period signal SOSC with a periodically generated pulse.

The self-refresh counter 122 may generate first to fourth self-counting signals PCNT<1:4> that are sequentially up-counted by the pulse of the self-period signal SOSC.

At time T3, in the self-period signal transmission circuit 123_1 of the self-refresh signal generator 123, the self-refresh entry signal SRET may be disabled at a logic "low" level, and the first to fourth self-counting signals PCNT<1:4> may be counted as a first logic level combination, so that a self-refresh pulse PSR may be generated from the self-period signal SOSC.

The internal refresh signal generation circuit 140 may output the self-refresh pulse PSR as the internal refresh signal IREF based on the enable signal ISREN at a logic "low" level.

The memory cells MC of the memory region 150 may be refreshed by a pulse of the internal refresh signal IREF.

At time T4, the self-refresh pulse generator 123 may generate the self-reset signal PRST at a logic "high" level when the self-refresh pulse PSR transitions from a logic "high" level to a logic "low" level.

The self-refresh counter 122 may generate first to fourth self-counting signals PCNT<1:4> in which all bits are initialized at a logic "low" level by the self-reset signal PRST at a logic "high" level.

Although the operation of generating the self-refresh pulse PSR after the time T4 is not shown in FIG. 7, whenever the first to fourth self-counting signals PCNT<1:4> are counted as the first logic level combination during the period in which the self-enable signal SEN is enabled at a logic "high" level, the self-refresh pulse PSR may be generated from the self-period signal SOSC.

At time T5, the command decoder 110 may generate a self-refresh end signal SREX at a logic "high" level to terminate the self-refresh operation.

The self-refresh pulse generator 123 may generate a self-reset signal PRST at a logic "high" level by the self-refresh end signal SREX at a logic "high" level.

The self-refresh counter 122 may generate first to fourth self-counting signals PCNT<1:4> in which all bits are initialized to a logic "low" level by the self-reset signal PRST at a logic "high" level.

In this way, the electronic device 10 may perform a refresh operation by a self-refresh pulse PSR that is generated at a time point at which a self-refresh entry signal SRET is generated, which is a self-refresh operation entry time, and may perform the refresh operation by a self-refresh pulse PSR that is generated whenever first to fourth self-counting signals PCNT<1:4> are counted as a first logic level combination. The electronic device 10 may perform the refresh operation by a self-refresh pulse PSR that is periodically generated during the self-refresh operation period.

Figure 8:
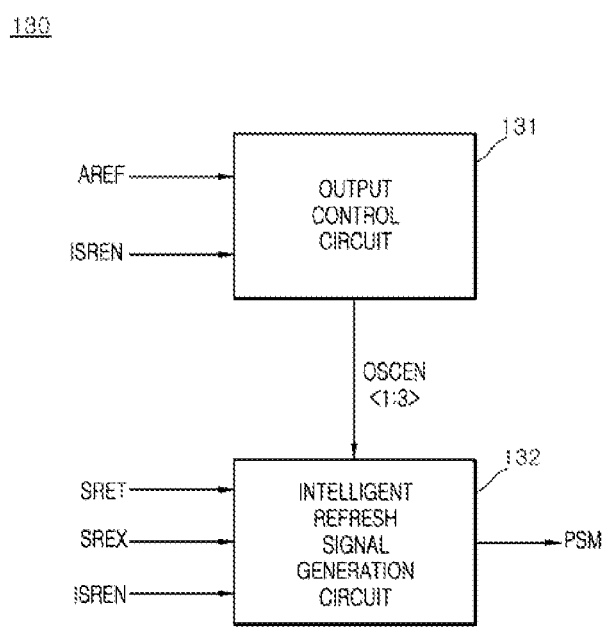
FIG. 8 is a block diagram illustrating a configuration of an intelligent refresh control circuit included in the electronic device that is illustrated in FIG. 1.

FIG. 8 is a block diagram according to an embodiment of the intelligent refresh control circuit 130 that is illustrated in FIG. 1. As illustrated in FIG. 8, the intelligent refresh control circuit 130 may include an output control circuit 131 and an intelligent refresh signal generation circuit 132.

The output control circuit 131 may generate first to third output control signals OSCEN<1:3> that are selectively enabled based on an auto refresh signal AREF and an enable signal ISREN during an intelligent refresh operation. The output control circuit 131 may generate the first to third output control signals OSCEN<1:3> that are selectively enabled based on the number of generations of the auto refresh signal AREF when the enable signal ISREN is enabled.

The intelligent refresh signal generation circuit 132 may generate an intelligent refresh pulse PSM with a pulse that has a generation period that is controlled based on a self-refresh entry signal SRET, a self-refresh end signal SREX, an enable signal ISREN, and the first to third output control signals OSCEN<1:3> during the intelligent refresh operation. The intelligent refresh signal generation circuit 132 may generate the intelligent refresh pulse PSM with a pulse that has a generation period that is controlled by the first to third output control signals OSCEN<1:3> from a time point at which the enable signal ISREN is enabled and the self-refresh entry signal SRET is input to a time point at which the self-refresh end signal SREX is input.

Figure 9:
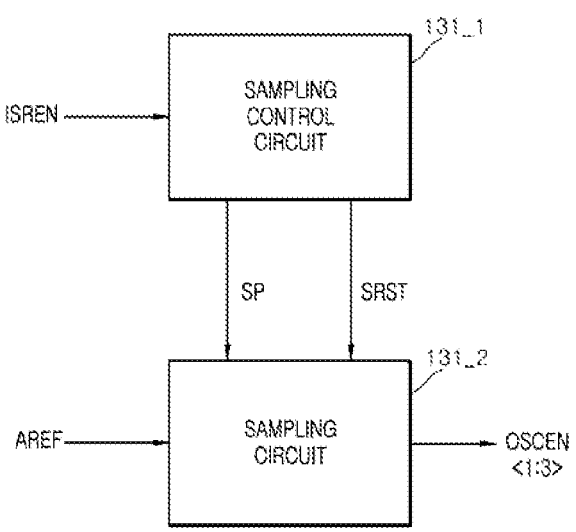
FIG. 9 is a block diagram illustrating a configuration of an output control circuit included in the intelligent refresh control circuit that is illustrated in FIG. 8.

FIG. 9 is a block diagram according to an embodiment of the output control circuit 131 that is illustrated in FIG. 8. As illustrated in FIG. 9, the output control circuit 131 may include a sampling control circuit 131_1 and a sampling circuit 131_2.

The sampling control circuit 131_1 may generate a sampling signal SP and a sampling reset signal SRST based on an enable signal ISREN. The sampling control circuit 131_1 may generate the sampling signal SP and the sampling reset signal SRST that are enabled after a predetermined period from a time point at which the enable signal ISREN is enabled.

The sampling circuit 1312 may generate first to third output control signals OSCEN<1:3> that are selectively enabled based on an auto refresh signal AREF, the sampling signal SP, and the sampling reset signal SRST. The sampling circuit 131_2 may generate the first to third output control signals OSCEN<1:3> that are selectively enabled based on the number of generations of the auto refresh signal AREF at a time point at which the sampling signal SP is input.

Figure 10:
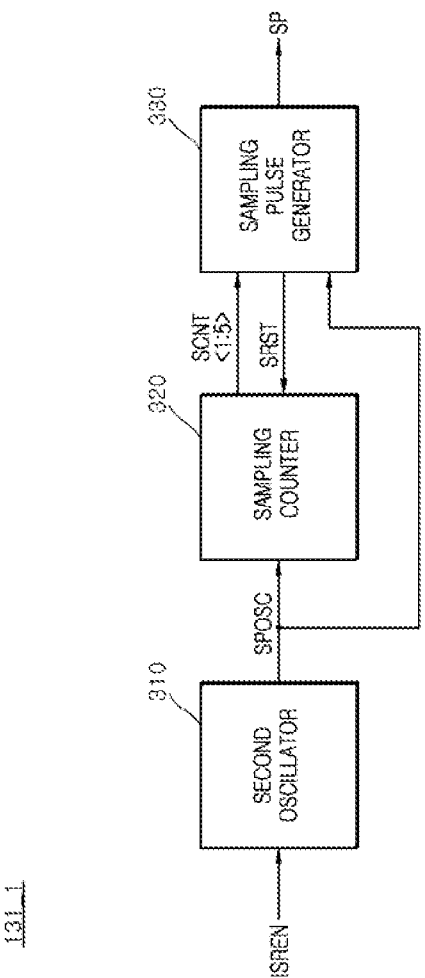
FIG. 10 is a block diagram illustrating a configuration of a sampling control circuit included in the output control circuit that is illustrated in FIG. 9.

FIG. 10 is a block diagram according to an embodiment of the sampling control circuit 131_1 that is illustrated in FIG. 9. As illustrated in FIG. 10, the sampling control circuit 1311 may include a second oscillator 310, a sampling counter 320, and a sampling pulse generator 330.

The second oscillator 310 may generate a sampling period signal SPOSC with a pulse that is periodically generated during a period in which an enable signal ISREN is enabled.

The sampling counter 320 may generate first to fifth sampling counting signals SCNT<1:5> that are counted by the pulse of the sampling period signal SPOSC. The sampling counter 320 may generate the first to fifth sampling counting signals SCNT<1:5> that are sequentially up-counted when a pulse of the sampling period signal SPOSC is input. The sampling counter 320 may generate the first to fifth sampling counting signals SCNT<1:5> that are initialized by a sampling reset signal SRST. The sampling counter 320 may generate the first to fifth sampling counting signals SCNT<1:5> in which all bits are initialized at a logic "low" level when the sampling reset signal SRST is enabled.

The sampling pulse generator 330 may generate a sampling pulse SP based on the first to fifth sampling counting signals SCNT<1:5>. The sampling pulse generator 330 may generate the sampling reset signal SRST after generating the sampling pulse SP from the sampling period signal SPOSC when the first to fifth sampling counting signals SCNT<1:5> are counted as a second logic level combination. The second logic level combination of the first to fifth sampling and counting signals SCNT<1:5> will be described in detail with reference to FIG. 12, which will be described later.

Figure 11:
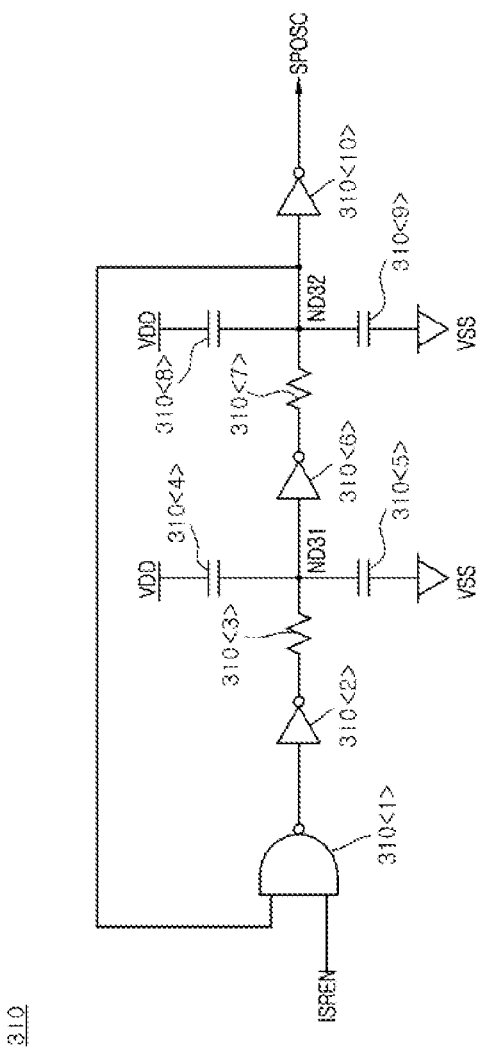
FIG. 11 is a circuit diagram illustrating a configuration of a second oscillator included in the sampling control circuit that is illustrated in FIG. 10.

FIG. 11 is a circuit diagram according to an embodiment of the second oscillator 310 that is illustrated in FIG. 10. As illustrated in FIG. 11, the second oscillator 310 may be implemented with a NAND gate 310<1>, inverters 310<2>, 310<6>, and 310<10>, resistors 310<3> and 310<7>, and capacitors 310<4>, 310<5>, 310<8>, and 310<9>.

The NAND gate 310<1>, the inverter 310<2>, and the resistor 310<3> may be connected in series between a node ND32 and a node ND31. The capacitor 310<4> may be connected between a power voltage VDD and the node ND31. The capacitor 310<5> may be connected between the node ND31 and a ground voltage VSS. The NAND gate 310<1> may act as an inverter when an enable signal ISREN is input at a logic "high" level.

The inverter 310<6> and the resistor 310<7> may be connected in series between the node ND31 and the node ND32. The capacitor 310<8> may be connected between the power voltage VDD and the node ND32. The capacitor 310<9> may be connected between the node ND32 and the ground voltage VSS.

The inverter 310<10> may inversely buffer a signal of the node ND32 to generate a sampling period signal SPOSC.

The second oscillator 310 may generate the sampling period signal SPOSC with a pulse that is periodically generated when the enable signal ISREN is input at a logic "high" level.

Figure 12:
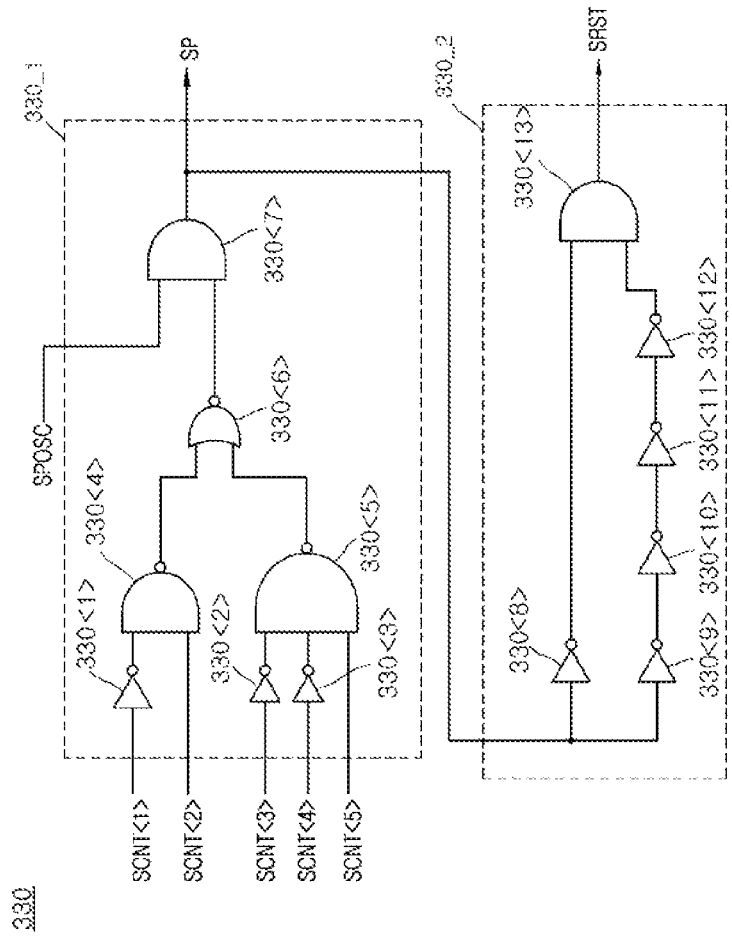
FIG. 12 is a circuit diagram illustrating a configuration of a sampling pulse generator included in the sampling control circuit that is illustrated in FIG. 10.

FIG. 12 is a circuit diagram according to an embodiment of the sampling pulse generator 330 that is illustrated in FIG. 10. As illustrated in FIG. 12, the sampling pulse generator 330 may include a sampling sensing circuit 330_1 and a sampling reset signal generation circuit 330_2.

The sampling sensing circuit 330_1 may be implemented with inverters 330<1>, 330<2>, and 330<3>, NAND gates 330<4> and 330<5>, a NOR gate 330<6>, and an AND gate 330<7>. The sampling sensing circuit 3301 may generate a sampling pulse SP from a sampling period signal SPOSC when first to fifth sampling counting signals SCNT<1:5> are counted as a second logic level combination. The second logic level combination of the first to fifth sampling counting signals SCNT<1:5> may refer to a case in which the first sampling counting signal SCNT<1> is counted as a logic "low" level, the second sampling counting signal SCNT<2> is counted as a logic "high" level, the third sampling counting signal SCNT<3> is counted as a logic "low" level, the fourth sampling counting signal SCNT<4> is counted as a logic "low" level, and the fifth sampling counting signal SCNT<5> is counted as a logic "high" level.

The sampling reset signal generation circuit 330_2 may be implemented with inverters 330<8>, 330<9>, 330<10>, 330<11>, and 330<12>, and an AND gate 330<13>. The sampling reset signal generation circuit 330_2 may generate a sampling reset signal SRST with a pulse that is generated when the sampling pulse SP transitions from a logic "high" level to a logic "low" level. The sampling reset signal generation circuit 3302 may generate the sampling reset signal SRST with a pulse width that corresponds to the delay time of the inverters 330<9>, 330<10>, 330<11>, and 330<12>.

Figure 13:
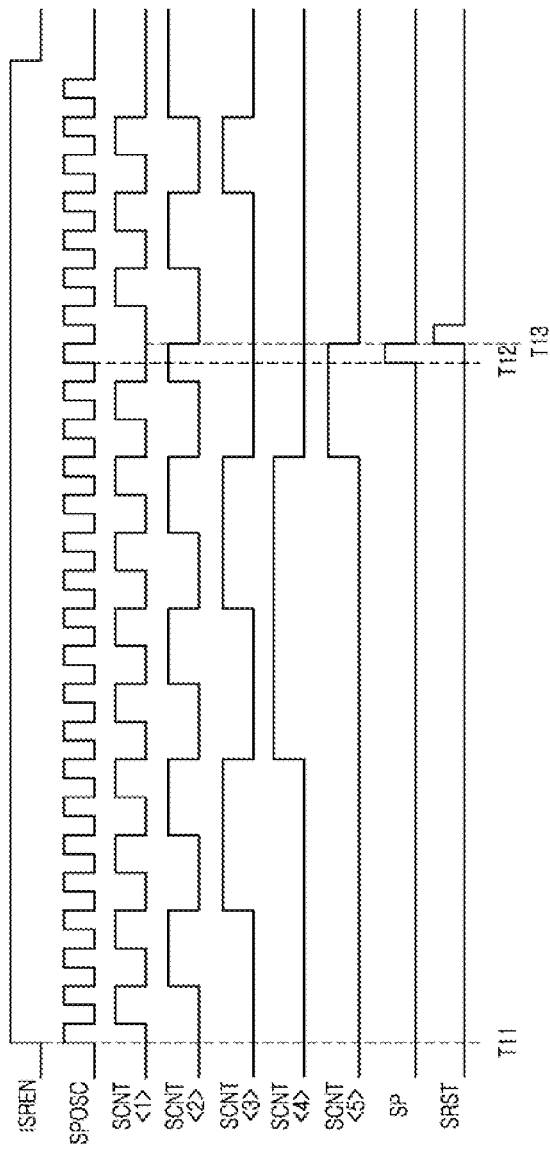
FIG. 13 is a timing diagram illustrating an operation of the sampling control circuit that is illustrated in FIG. 10.

FIG. 13 is a timing diagram illustrating an operation of the sampling control circuit 131_1 that is illustrated in FIG. 10. The operation of the sampling control circuit 131_1 according to an embodiment of the present disclosure will be described with reference to FIG. 13, but the intelligent refresh operation will be described as follows.

At time T11, a command decoder 110 may decode the commands CMD<1:N>, which are logic level combinations to perform an intelligent refresh operation, to generate an enable signal ISREN at a logic "high" level.

The second oscillator 310 may generate a sampling period signal SPOSC with a pulse that is periodically generated during a period in which the enable signal ISREN is enabled to a logic "high" level.

The sampling counter 320 may generate the first to fifth sampling counting signals SCNT<1:5> that are sequentially up-counted when the pulse of the sampling period signal SPOSC is input.

At time T12, the sampling pulse generator 330 may generate the sampling pulse SP from the sampling period signal SPOSC when the first to fifth sampling counting signals SCNT<1:5> are counted as the second logic level combination. The second logic level combination of the first to fifth sampling counting signals SCNT<1:5> may refer to a case in which the first sampling counting signal SCNT<1> is counted as a logic "low" level, the second sampling counting signal SCNT<2> is counted as a logic "high" level, the third sampling counting signal SCNT<3> is counted as a logic "low" level, the fourth sampling counting signal SCNT<4> is counted as a logic "low" level, and the fifth sampling counting signal SCNT<5> is counted as a logic "high" level.

At time T13, the sampling pulse generator 330 may generate a sampling reset signal SRST at a logic "high" level when the sampling pulse SP transitions from a logic "high" level to a logic "low" level.

The sampling counter 320 may generate the first to fifth sampling counting signals SCNT<1:5> in which all bits are initialized at a logic "low" level by the sampling reset signal SRST at a logic "high" level.

Figure 14:
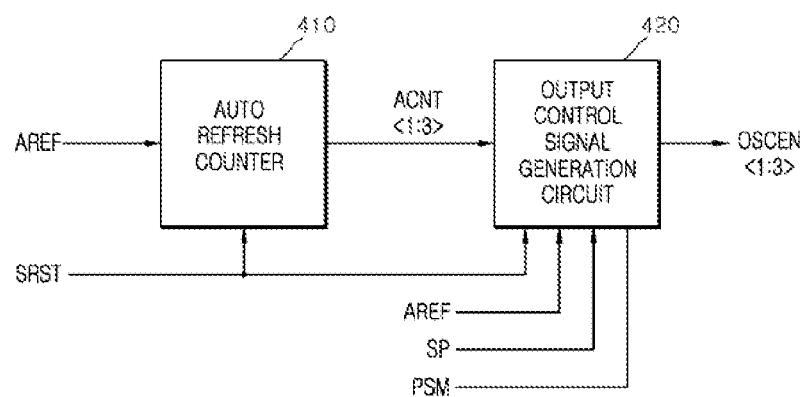
FIG. 14 is a block diagram illustrating a configuration of a sampling circuit included in the output control circuit that is illustrated in FIG. 9.

FIG. 14 is a block diagram according to an embodiment of the sampling circuit 131_2 that is illustrated in FIG. 9. As illustrated in FIG. 14, the sampling circuit 1312 may include an auto refresh counter 410 and an output control signal generation circuit 420.

The auto refresh counter 410 may generate first to third auto counting signals ACNT<1:3> counted by a pulse of an auto refresh signal AREF. The auto refresh counter 410 may generate the first to third auto counting signals ACNT<1:3> that are sequentially up-counted when the pulse of the auto refresh signal AREF is input. The auto refresh counter 410 may generate the first to third auto counting signals ACNT<1:3> that are initialized by a sampling reset signal SRST. The auto refresh counter 410 may generate the first to third auto counting signals ACNT<1:3> in which all bits are initialized at a logic "low" level when the sampling reset signal SRST is enabled.

The output control signal generation circuit 420 may generate first to third output control signals OSCEN<1:3> that are selectively enabled based on the first to third auto counting signals ACNT<1:3> in synchronization with the sampling signal SP and an intelligent refresh pulse PSM when the auto refresh signal AREF is generated. The output control signal generation circuit 420 may generate the first to third output control signals OSCEN<1:3> in which all bits are initialized at a logic "low" level when the sampling reset signal SRST is enabled.

Figure 15:
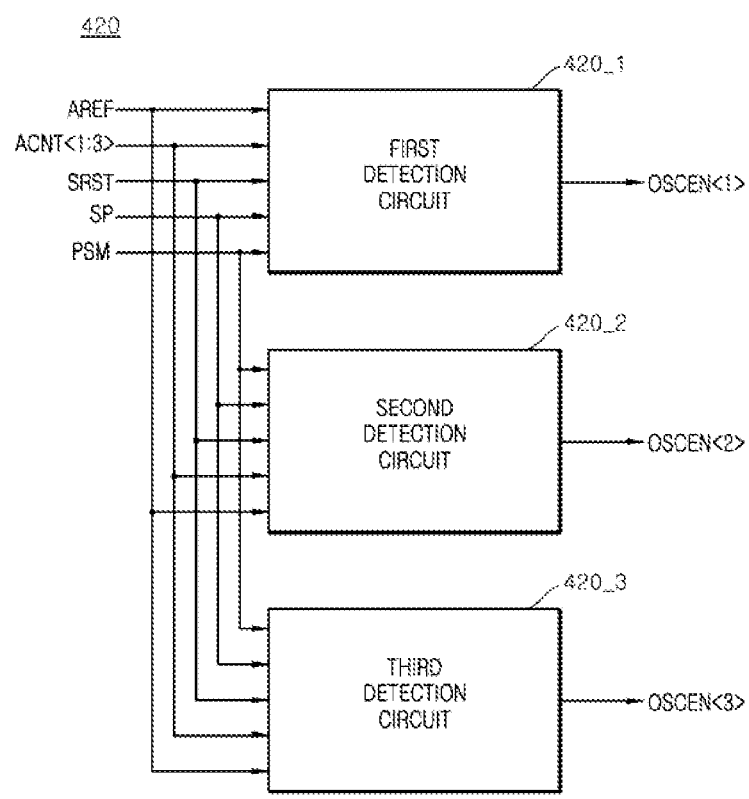
FIG. 15 a block diagram illustrating a configuration of an output control signal generation circuit included in the sampling circuit that is illustrated in FIG. 14.

FIG. 15 a block diagram according to an embodiment of the output control signal generation circuit 420 that is illustrated in FIG. 14. As illustrated in FIG. 15, the output control signal generation circuit 420 may include a first sensing circuit 420_1, a second sensing circuit 420_2, and a third sensing circuit 420_3.

The first sensing circuit 420_1 may generate a first output control signal OSCEN<1> that is enabled when the first to third auto-counting signals ACNT<1:3> are counted as a third logic level combination in synchronization with the sampling signal SP and the intelligent refresh pulse PSM when the auto refresh signal AREF is generated. The first sensing circuit 420_1 may generate the first output control signal OSCEN<1> that is initialized at a logic "low" level when the sampling reset signal SRST is enabled. The third logic level combination of the first to third auto counting signals ACNT<1:3> will be described in detail with reference to FIG. 16, which will be described later.

The second sensing circuit 420_2 may generate a second output control signal OSCEN<2> that is enabled when the first to third auto-counting signals ACNT<1:3> are counted as a fourth logic level combination in synchronization with the sampling signal SP and the intelligent refresh pulse PSM when the auto refresh signal AREF is generated. The second sensing circuit 4202 may generate the second output control signal OSCEN<2> that is initialized at a logic "low" level when the sampling reset signal SRST is enabled. The fourth logic level combination of the first to third auto counting signals ACNT<1:3> will be described in detail with reference to FIG. 17, which will be described later.

The third sensing circuit 420_3 may generate a third output control signal OSCEN<2> that is enabled when the first to third auto-counting signals ACNT<1:3> are counted as the fifth logic level combination in synchronization with the sampling signal SP and the intelligent refresh pulse PSM when the auto refresh signal AREF is generated. The third sensing circuit 420_3 may generate the third output control signal OSCEN<3> that is initialized at a logic "low" level when the sampling reset signal SRST is enabled. The fifth logic level combination of the first to third auto counting signals ACNT<1:3> will be described in detail with reference to FIG. 18, which will be described later.

Figure 16:
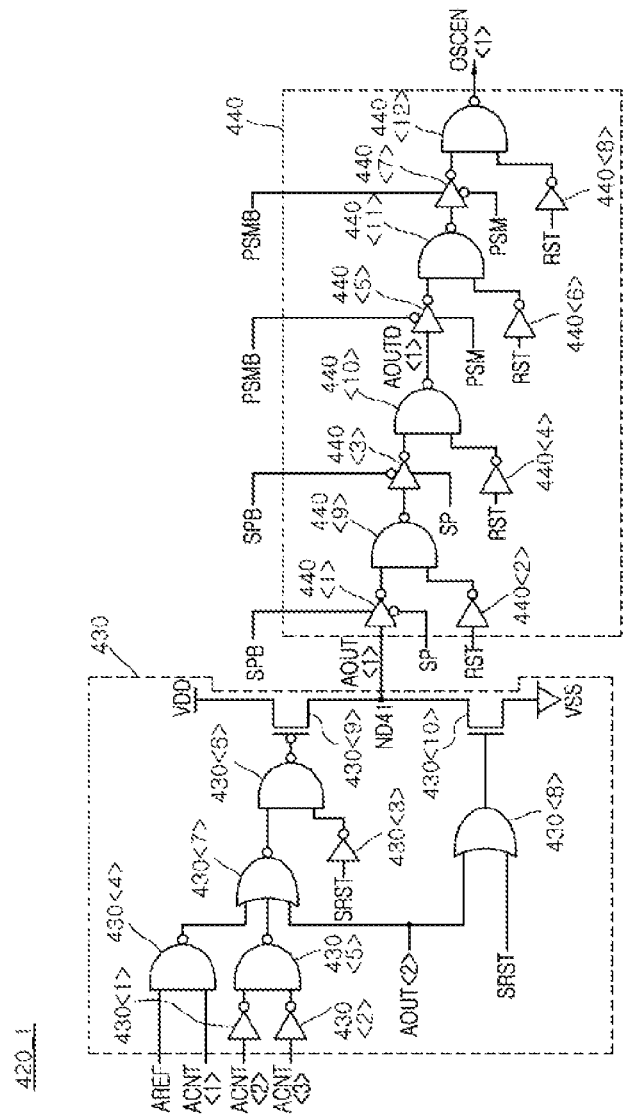
FIG. 16 is a circuit diagram illustrating a configuration of a first sensing circuit included in the output control signal generation circuit that is illustrated in FIG. 15.

FIG. 16 is a circuit according to an embodiment of the first sensing circuit 420_1 that is illustrated in FIG. 15. As illustrated in FIG. 16, the first sensing circuit 420_1 may include a first pre-output control signal generation circuit 430 and a first signal transmission circuit 440.

The first pre-output control signal generation circuit 430 may be implemented with inverters 430<1>, 430<2>, and 430<3>, NAND gates 430<4>, 430<5>, and 430<6>, a NOR gate 430<7>, an OR gate 430<8>, a PMOS transistor 430<9>, and an NMOS transistor 430<10>. The first pre-output control signal generation circuit 430 may drive a node ND41 to a power voltage VDD level to generate a first pre-output control signal AOUT<1> when an auto refresh signal AREF is enabled at a logic "high" level, a second pre-output control signal AOUT<2> is disabled at a logic "low" level, and first to third auto counting signals ACNT<1:3> are counted as a third logic level combination. The first pre-output control signal generation circuit 430 may drive the node ND41 to a ground voltage VSS level to generate the first pre-output control signal AOUT<1> when the second pre-output control signal AOUT<2> is enabled at a logic "high" level. The first pre-output control signal generation circuit 430 may drive the node ND41 to the ground voltage VSS level to generate the first pre-output control signal AOUT<1> at a logic "low" level when a sampling reset signal SRST is enabled at a logic "high" level. The third logic level combination of the first to third auto counting signals ACNT<1:3> may refer to a case in which the first auto counting signal ACNT<1> is counted as a logic "high" level, the second auto counting signal ACNT<2> is counted as a logic "low" level, and the third auto counting signal ACNT<3> is counted as a logic "low" level.

The first signal transmission circuit 440 may be implemented with inverters 440<1>, 440<2>, 440<3>, 440<4>, 440<5>, 440<6>, 440<7>, and 440<8>, and NAND gates 440<9>, 440<10>, 440<11>, and 440<12>. The first signal transmission circuit 440 may receive the first pre-output control signal AOUT<1> when the sampling signal SP is disabled at a logic "low" level and the reset signal RST is disabled at a logic "low" level. The first signal transmission circuit 440 may buffer the first pre-output control signal AOUT<1> input when the sampling signal SP is enabled at a logic "high" level and the reset signal RST is disabled at a logic "low" level to generate a first pre-delay output control signal AOUTD<1>. The first signal transmission circuit 440 may buffer a first pre-delay output control signal AOUTD<1> to generate a first output control signal OSCEN<1> when the intelligent refresh pulse PSM is disabled at a logic "low" level and the reset signal RST is disabled at a logic "low" level. The first signal transmission circuit 440 may generate the first output control signal OSCEN<1> that is initialized at a logic "high" level when the reset signal RST is enabled at a logic "high" level during an initialization operation. An inverted sampling signal SPB, illustrated in FIG. 16, is a signal that is obtained by inverting the sampling signal SP. The inverted intelligent refresh pulse PSMB, illustrated in FIG. 16, is a signal that is obtained by inverting the intelligent refresh pulse PSM.

Figure 17:
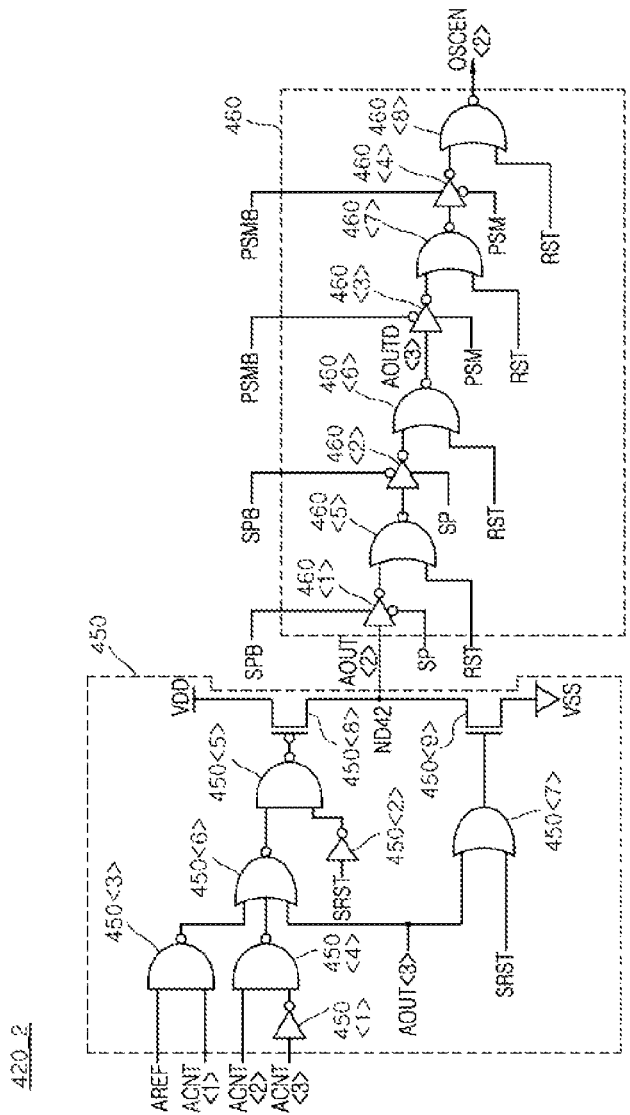
FIG. 17 is a circuit diagram illustrating a configuration of a second sensing circuit included in the output control signal generation circuit that is illustrated in FIG. 15.

FIG. 17 is a circuit diagram according to an embodiment of the second sensing circuit 420_2 that is illustrated in FIG. 15. As illustrated in FIG. 17, the second sensing circuit 420_2 may include a second pre-output control signal generation circuit 450 and a second signal transmission circuit 460.

The second pre-output control signal generation circuit 450 may be implemented with inverters 450<1> and 450<2>, NAND gates 450<3>, 450<4>, and 450<5>, a NOR gate 450<6>, an OR gate 450<7>, a PMOS transistor 450<8>, and an NMOS transistor 450<9>. The second pre-output control signal generation circuit 450 may drive a node ND42 to a power supply voltage VDD level to generate a second pre-output control signal AOUT<2> at a logic "high" level when an auto refresh signal AREF is enabled at a logic "high" level, a third pre-output control signal AOUT<3> is disabled at a logic "low" level, and first to third auto counting signals ACNT<1:3> are counted as a fourth logic level combination. The second pre-output control signal generation circuit 450 may drive the node ND42 to a ground voltage VSS level to generate the second pre-output control signal AOUT<2> at a logic "low" level when the third pre-output control signal AOUT<3> is enabled at a logic "high" level. The second pre-output control signal generation circuit 450 may drive the node ND42 to the ground voltage VSS level to generate the second pre-output control signal AOUT<2> at a logic "low" level when the sampling reset signal SRST is enabled at a logic "high" level. The fourth logic level combination of the first to third auto counting signals ACNT<1:3> may refer to a case in which the first auto counting signal ACNT<1> is counted as a logic "high" level, the second auto counting signal ACNT<2> is counted as a logic "high" level, and the third auto counting signal ACNT<3> is counted as a logic "low" level.

The second signal transmission circuit 460 may be implemented with inverters 460<1>, 460<2>, 460<3>, and 460<4> and NOR gates 460<5>, 460<6>, 460<7>, and 460<8>. The second signal transmission circuit 460 may receive the second pre-output control signal AOUT<2> when a sampling signal SP is disabled at a logic "low" level and a reset signal RST is disabled at a logic "low" level. The second signal transmission circuit 460 may buffer the second pre-output control signal AOUT<2> input when the sampling signal SP is enabled at a logic "high" level and the reset signal RST is disabled at a logic "low" level to generate the second pre-delay output control signal AOUTD<2>. The second signal transmission circuit 460 may buffer the second pre-delay output control signal AOUTD<2> to generate a second output control signal OSCEN<2> when an intelligent refresh pulse PSM is disabled at a logic "low" level and the reset signal RST is disabled at a logic "low" level. The second signal transmission circuit 460 may generate the second output control signal OSCEN<2> that is initialized at a logic "low" level when the reset signal RST is enabled at a logic "high" level during the initialization operation. The inverted sampling signal SPB, illustrated in FIG. 17, is a signal that is obtained by inverting the sampling signal SP. The inverted intelligent refresh pulse PSMB, illustrated in FIG. 17, is a signal that is obtained by inverting the intelligent refresh pulse PSM.

Figure 18:
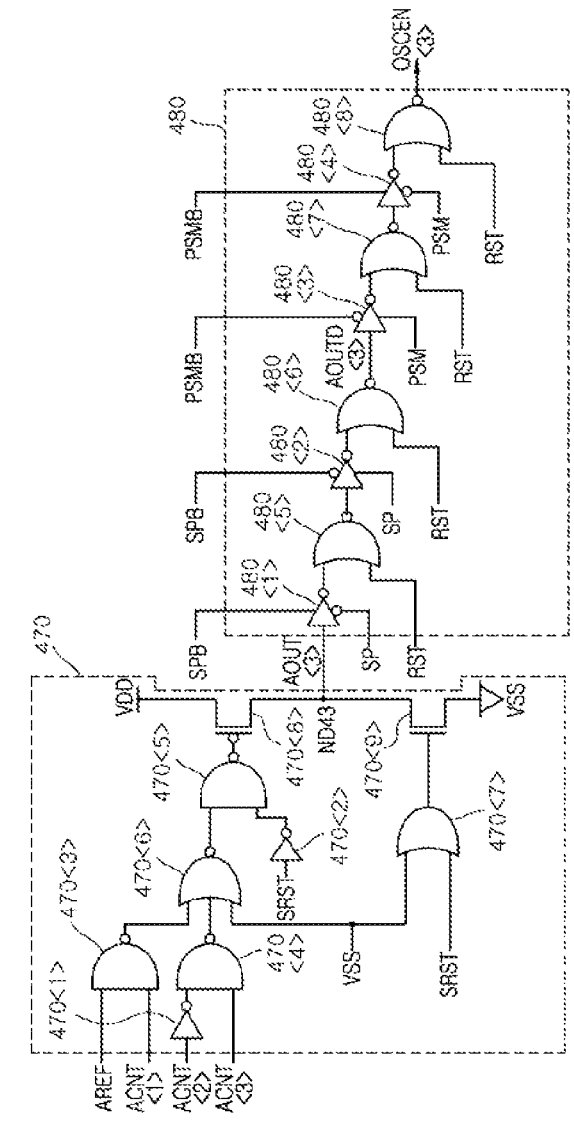
FIG. 18 is a circuit diagram illustrating a configuration of a third sensing circuit included in the output control signal generation circuit that is illustrated in FIG. 15.

FIG. 18 is a circuit diagram according to an embodiment of the third sensing circuit 420_3 that is illustrated in FIG. 15. As illustrated in FIG. 18, the third sensing circuit 420_3 may include a third pre-output control signal generation circuit 470 and a third signal transmission circuit 480.

The third pre-output control signal generation circuit 470 may be implemented with inverters 470<1> and 470<2>, NAND gates 470<3>, 470<4>, and 470<5>, a NOR gate 470<6>, an OR gate 470<7>, a PMOS transistor 470<8>, and an NMOS transistor 470<9>. The third pre-output control signal generation circuit 470 may drive a node ND43 to a power voltage VDD level to generate a third pre-output control signal AOUT<3> at a logic "high" level when an auto refresh signal AREF is enabled at a logic "high" level and first to third auto counting signals ACNT<1:3> are counted as a fifth logic level combination. The third pre-output control signal generation circuit 470 may drive the node ND43 to a ground voltage VSS level to generate the third pre-output control signal AOUT<3> at a logic "low" level when the sampling reset signal SRST is enabled at a logic "high" level. The fifth logic level combination of the first to third auto-counting signals ACNT<1:3> may refer to a case in which the first auto counting signal ACNT<1> is counted as a logic "high" level, the second auto counting signal ACNT<2> is counted as a logic "low" level, and the third auto counting signal ACNT<3> is counted as a logic "high" level.

The third signal transmission circuit 480 may be implemented with inverters 480<1>, 480<2>, 480<3>, and 480<4> and NOR gates 480<5>, 480<6>, 480<7>, and 480<8>. The third signal transmission circuit 480 may receive a third pre-output control signal AOUT<3> when a sampling signal SP is disabled at a logic "low" level and a reset signal RST is disabled at a logic "low" level. The third signal transmission circuit 480 may buffer the third pre-output control signal AOUT<3> input when the sampling signal is enabled at a logic "high" level and the reset signal RST is disabled at a logic "low" level to generate a third pre-delay output control signal AOUTD<3>. The third signal transmission circuit 480 may buffer the third pre-delay output control signal AOUTD<3> to generate a third output control signal OSCEN<3> when an intelligent refresh pulse PSM is disabled at a logic "low" level and the reset signal RST is disabled at a logic "low" level. The third signal transmission circuit 480 may generate the third output control signal OSCEN<3> that is initialized at a logic "low" level when the reset signal RST is enabled at a logic "high" level during the initialization operation. The inverted sampling signal SPB, illustrated in FIG. 18, is a signal that is obtained by inverting the sampling signal SP. The inverted intelligent refresh pulse PSMB, illustrated in FIG. 18, is a signal that is obtained by inverting the intelligent refresh pulse PSM.

Figure 19:
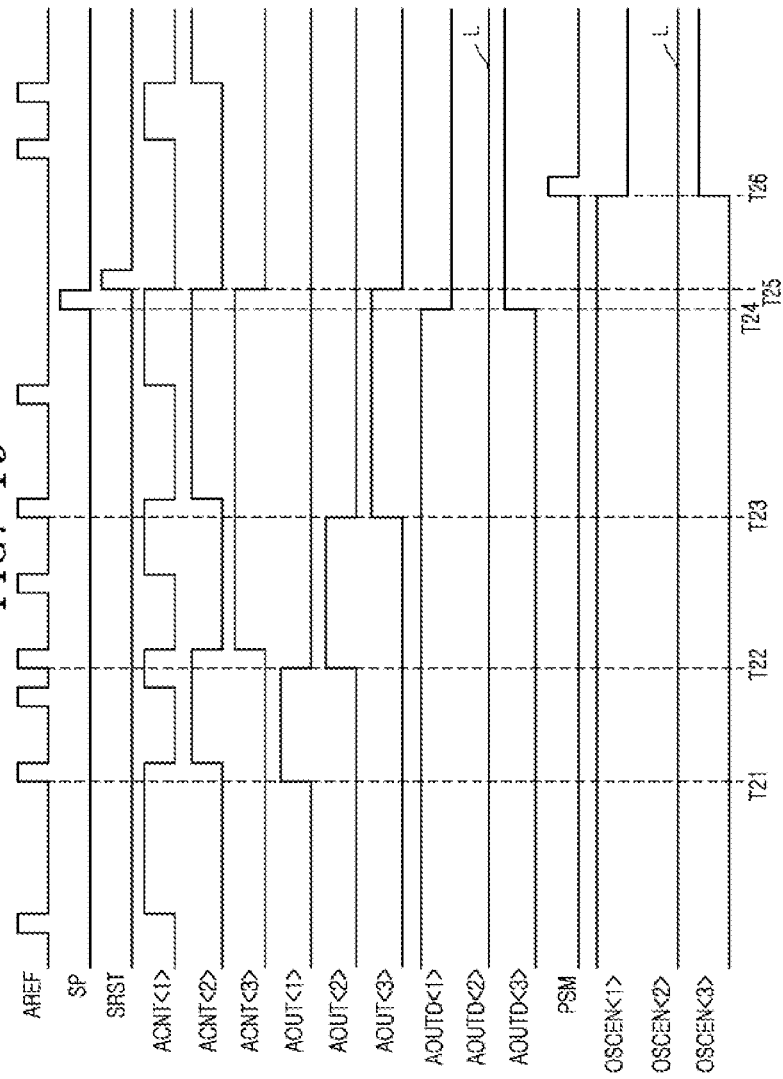
FIG. 19 is a timing diagram illustrating an operation of the sampling circuit that is illustrated in FIG. 14.

FIG. 19 is a timing diagram illustrating an operation of the sampling circuit 131_2 that is illustrated in FIG. 14. The operation of the sampling circuit 131_2 according to an embodiment of the present disclosure will be described with reference to FIG. 19 together with FIGS. 14 to 18, but the intelligent refresh operation will be described as follows.

Prior to description, the auto refresh counter 410 may generate the first to third auto counting signals ACNT<1:3> that are sequentially up-counted when the pulses of the auto refresh signal AREF are input.

At time T21, the first pre-output control signal generation circuit 430 of the first sensing circuit 420_1 may generate the first pre-output control signal AOUT<1> at a logic "high" level when the auto refresh signal AREF is enabled at a logic "high" level, the second pre-output control signal AOUT<2> is disabled at a logic "low" level, and the first to third auto counting signals ACNT<1:3> are counted as a third logic level combination. The third logic level combination of the first to third auto counting signals ACNT<1:3> may refer to a case in which the first auto counting signal ACNT<1> is counted as a logic "high" level, the second auto counting signal ACNT<2> is counted as a logic "low" level, and the third auto counting signal ACNT<3> is counted as a logic "low" level.

The first signal transmission circuit 440 of the first sensing circuit 420_1 may receive the first pre-output control signal AOUT<1> based on the sampling signal SP at a logic "low" level.

At time T22, the second pre-output control signal generation circuit 450 of the second sensing circuit 420_2 may generate the second pre-output control signal AOUT<2> at a logic "high" level when the auto refresh signal AREF is enabled at a logic "high" level, the third pre-output control signal AOUT<3> is disabled at a logic low level, and the first to third auto counting signals ACNT<1:3> are counted as the fourth logic level combination. The fourth logic level combination of the first to third auto counting signals ACNT<1:3> may refer to a case in which the first auto counting signal ACNT<1> is counted as a logic "high" level, the second auto counting signal ACNT<2> is counted as a logic "high" level, and the third auto counting signal ACNT<3> is counted as a logic "low" level.

The first pre-output control signal generating circuit 430 of the first sensing circuit 420_1 may generate a first pre-output control signal AOUT<1> at a logic "low" level when the second pre-output control signal AOUT<2> is enabled to a logic "high" level. The first signal transmission circuit 440 of the first sensing circuit 4201 may receive the first pre-output control signal AOUT<1> based on the sampling signal SP at a logic "low" level.

The second signal transmission circuit 460 of the second sensing circuit 420_2 may receive the second pre-output control signal AOUT<2> based on the sampling signal SP at a logic "low" level.

At time T23, the third pre-output control signal generation circuit 470 of the third sensing circuit 420_3 may generate the third pre-output control signal AOUT<3> at a logic "high" level when the auto refresh signal AREF is enabled at a logic "high" level, and the first to third auto counting signals ACNT<1:3> may be counted as a fifth logic level combination. The fifth logic level combination of the first to third auto counting signals ACNT<1:3> may refer to a case in which the first auto counting signal ACNT<1> is counted as a logic "high" level, the second auto counting signal ACNT<2> is counted as a logic "low" level, and the third auto counting signal ACNT<3> is counted as a logic "high" level.

The second pre-output control signal generation circuit 450 of the second sensing circuit 420_2 may generate the second pre-output control signal AOUT<2> at a logic "low" level when the third pre-output control signal AOUT<3> is enabled at a logic "high" level. The second signal transmission circuit 460 of the second sensing circuit 420_2 may receive the second pre-output control signal AOUT<2> based on the sampling signal SP at a logic "low" level.

The third signal transmission circuit 480 of the third sensing circuit 420_3 may receive the third pre-output control signal AOUT<3> based on the sampling signal SP at a logic "low" level.

At time T24, as illustrated in FIG. 13, the sampling pulse generator 330 may generate the sampling signal SP from the sampling period signal SPOSC when the first to fifth sampling counting signals SCNT<1:5> are counted as a second logic level combination.

The first signal transmission circuit 440 of the first sensing circuit 420_1 may buffer the first pre-output control signal AOUT<1> with the sampling signal SP at a logic "high" level to generate a first pre-delay output control signal AOUTD<1> at a logic "low" level.

The second signal transmission circuit 460 of the second sensing circuit 4202 may buffer the second pre-output control signal AOUT<2> with the sampling signal SP at a logic "high" level to generate a second pre-delay output control signal AOUTD<2> at a logic "low" level.

The third signal transmission circuit 480 of the third sensing circuit 420_3 may buffer the third pre-output control signal AOUT<3> with the sampling signal SP at a logic "high" level to generate a third pre-delay output control signal AOUTD<3> at a logic "high" level.

At time T25, the sampling pulse generator 330 may generate a sampling reset signal SRST at a logic "high" level when the sampling signal SP transitions from a logic "high" level to a logic "low" level.

The auto refresh counter 410 may generate the first to third auto counting signals ACNT<1:3> in which all bits are initialized at a logic "low" level by the sampling reset signal SRST at a logic "high" level.

At time T26, the first signal transmission circuit 440 of the first sensing circuit 420_1 may buffer the first pre-delay output control signal AOUTD<1> with the intelligent refresh pulse PSM at a logic "low" level to generate the first output control signal OSCEN<1> at a logic "low" level. When the first output control signal OSCEN<1> is generated at a logic "high" level, it means that the auto refresh signal AREF is generated 1 to 2 times.

The second signal transmission circuit 460 of the second sensing circuit 420_2 may buffer the second pre-delay output control signal AOUTD<2> with the intelligent refresh pulse PSM at a logic "low" level to generate the second output control signal OSCEN<2> at a logic "low" level. When the second output control signal OSCEN<2> is generated at a logic "high" level, it means that the auto refresh signal AREF is generated 3 to 5 times.

The third signal transmission circuit 480 of the third sensing circuit 420_3 may buffer the third pre-delay output control signal AOUTD<3> with the intelligent refresh pulse PSM at a logic "low" level to generate the third output control signal OSCEN<3> at a logic "high" level. When the third output control signal OSCEN<3> is generated at a logic "high" level, it means that the auto refresh signal AREF is generated 6 times or more.

As described above, the sampling circuit 131_2 according to an embodiment of the present disclosure may generate the first to third output control signals OSCEN<1:3> that are selectively enabled depending on the number of generations of the auto refresh signal AREF.

Figure 20:
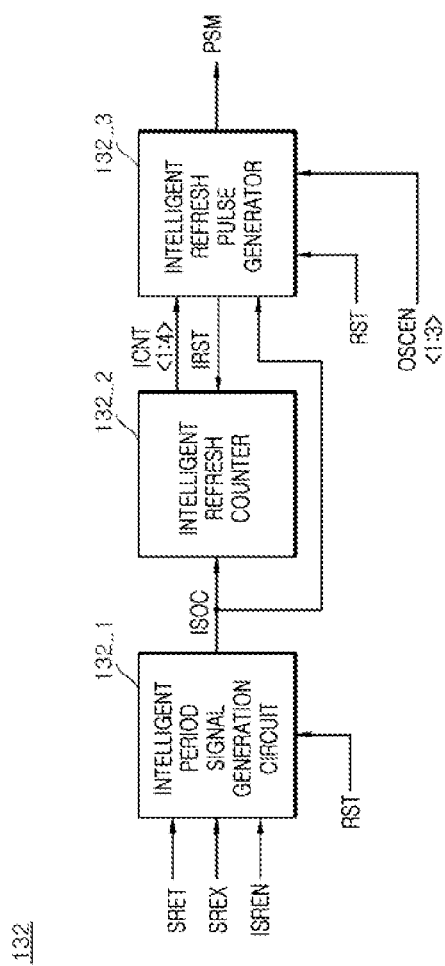
FIG. 20 is a block diagram illustrating a configuration of an intelligent refresh signal generation circuit included in the intelligent refresh control circuit that is illustrated in FIG. 8.

FIG. 20 is a block diagram according to an embodiment of an intelligent refresh signal generation circuit 132 that is illustrated in FIG. 8. As illustrated in FIG. 20, the intelligent refresh signal generation circuit 132 may include an intelligent period signal generation circuit 132_1, an intelligent refresh counter 132_2, and an intelligent refresh pulse generator 132_3.

The intelligent period signal generation circuit 132_1 may generate an intelligent period signal IOSC with a pulse that is periodically generated from a time point at which an enable signal ISREN is enabled and a self-refresh entry signal SRET is input to a time point at which a self-refresh end signal SREX is input. The intelligent period signal generation circuit 132_1 may generate the intelligent period signal IOSC disabled by a reset signal RST.

The intelligent refresh counter 1322 may generate first to fourth intelligent counting signals ICNT<1:4> counted by a pulse of the intelligent period signal IOSC. The intelligent refresh counter 1322 may generate the first to fourth intelligent counting signals ICNT<1:4> that are sequentially up-counted when the pulse of the intelligent period signal IOSC is input. The intelligent refresh counter 1322 may generate the first to fourth intelligent counting signals ICNT<1:4> that are initialized by an intelligent reset signal IRST. The intelligent refresh counter 132_2 may generate the first to fourth intelligent counting signals ICNT<1:4> in which all bits are initialized at a logic "low" level when the intelligent reset signal IRST is enabled.

The intelligent refresh pulse generator 132_3 may generate the intelligent refresh pulse PSM from the intelligent period signal IOSC based on a logic level combination of the first to third output control signals OSCEN<1:3> and the first to fourth intelligent counting signals ICNT<1:4>. The intelligent refresh pulse generator 1323 may generate the intelligent reset signal IRST based on the reset signal RST and the intelligent refresh pulse PSM.

Figure 21:
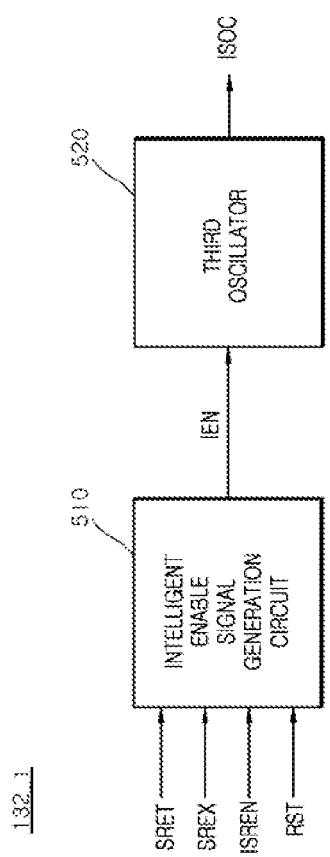
FIG. 21 is a block diagram illustrating a configuration of an intelligent period signal generation circuit included in the intelligent refresh signal generation circuit that is illustrated in FIG. 20.

FIG. 21 is a block diagram according to an embodiment of an intelligent period signal generation circuit 132_1 that is illustrated in FIG. 20. As illustrated in FIG. 21, the intelligent period signal generation circuit 132_1 may include an intelligent enable signal generation circuit 510 and a third oscillator 520.

The intelligent enable signal generation circuit 510 may generate an intelligent enable signal IEN that is enabled from a time point at which the enable signal ISREN is enabled and the self-refresh entry signal SRET is input to a time point at which the self-refresh end signal SREX is input. The intelligent enable signal generation circuit 510 may generate the intelligent enable signal IEN that is disabled by the reset signal RST.

The third oscillator 520 may generate the intelligent period signal IOSC with a pulse that is periodically generated during a period in which the intelligent enable signal IEN is enabled.

Figure 22:
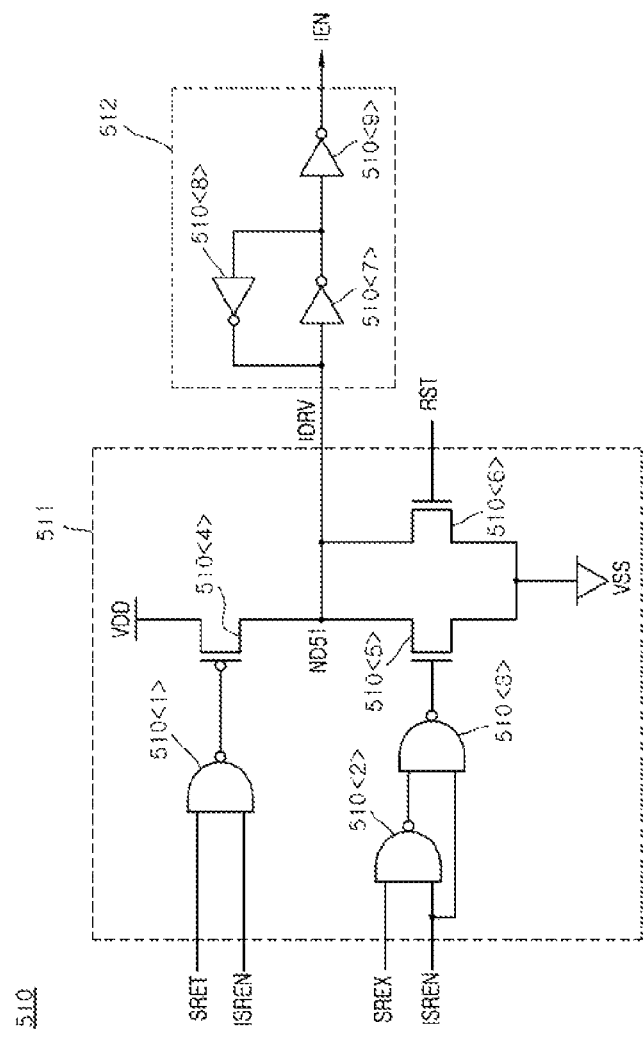
FIG. 22 is a circuit diagram illustrating a configuration of an intelligent enable signal generation circuit included in the intelligent period signal generation circuit that is illustrated in FIG. 21.

FIG. 22 is a block diagram according to an embodiment of the intelligent enable signal generation circuit 510 that is illustrated in FIG. 21. As illustrated in FIG. 22, the intelligent enable signal generation circuit 510 may include an intelligent drive signal generation circuit 511 and a second latch circuit 512.

The intelligent drive signal generation circuit 511 may be implemented with NAND gates 510<1>, 510<2>, and 510<3>, a PMOS transistor 510<4>, and NMOS transistors 510<5> and 510<6>. The intelligent drive signal generation circuit 511 may drive a node ND51 to a power voltage VDD level to generate an intelligent drive signal IDRV at a logic "high" level when the enable signal ISREN is enabled at a logic "high" level and the self-refresh entry signal SRET is input at a logic "high" level. The intelligent drive signal generation circuit 511 may drive the node ND51 to a ground voltage VSS level to generate an intelligent drive signal IDRV at a logic "low" level when the enable signal ISREN is enabled at a logic "high" level and the self-refresh end signal SREX is input at a logic "high" level. The intelligent drive signal generation circuit 511 may drive the node ND51 to the ground voltage VSS level to generate the intelligent drive signal IDRV at a logic "low" level when the reset signal RST is enabled at a logic "high" level.

The second latch circuit 512 may be implemented with inverters 510<7>, 510<8>, and 510<9>. The second latch circuit 512 may latch the intelligent drive signal IDRV and buffer the latched intelligent drive signal IDRV to generate the intelligent enable signal IEN.

Figure 23:
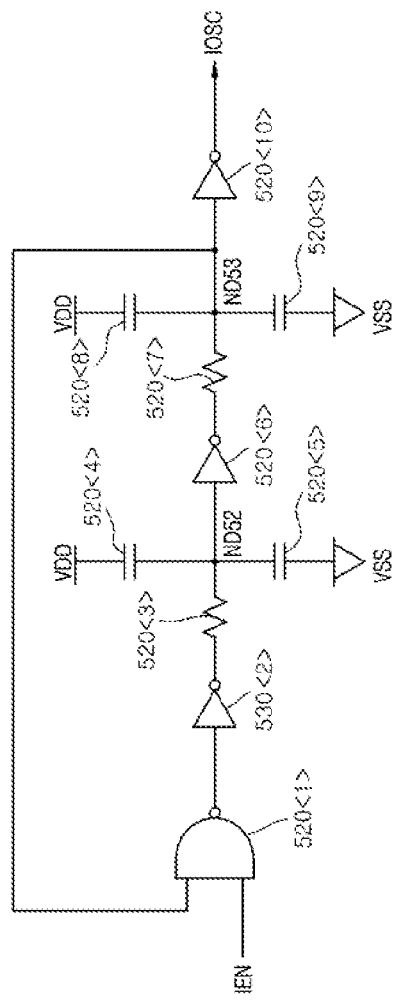
FIG. 23 is a circuit diagram illustrating a configuration of a third oscillator included in the intelligent period signal generation circuit that is illustrated in FIG. 21.

FIG. 23 is a block diagram according to an embodiment of the third oscillator 520 that is illustrated in FIG. 21. As illustrated in FIG. 23, the third oscillator 520 may be implemented with a NAND gate 520<1>, inverters 520<2>, 520<6>, and 520<10>, resistors 520<3> and 520<7>, and capacitors 520<4>, 520<5>, 520<8>, and 520<9>.

The NAND gate 520<1>, the inverter 520<2>, and the resistor 520<3> may be connected in series between a node ND53 and a node ND52. The capacitor 520<4> may be connected between a power voltage VDD and the node ND52. The capacitor 520<5> may be connected between the node ND52 and a ground voltage VSS. The NAND gate 520<1> may act as an inverter when an intelligent enable signal IEN is input at a logic "high" level.

The inverter 520<6> and the resistor 520<7> may be connected in series between the node ND52 and the node ND53. The capacitor 520<8> may be connected between the power voltage VDD and the node ND53. The capacitor 520<9> may be connected between the node ND53 and the ground voltage VSS.

The inverter 520<10> may inversely buffer a signal of the node ND53 to generate an intelligent period signal IOSC.

The third oscillator 520 may generate the intelligent period signal IOSC with a pulse that is periodically generated when the intelligent enable signal IEN is input at a logic "high" level.

Figure 24:
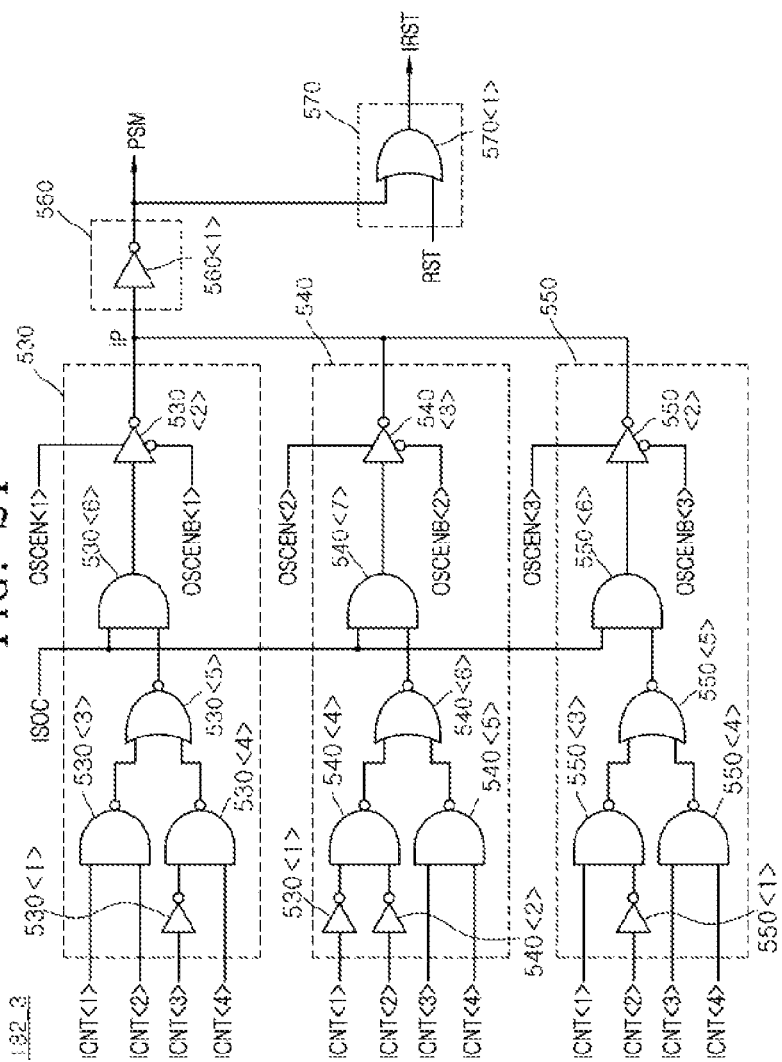
FIG. 24 is a circuit diagram illustrating a configuration of an intelligent refresh pulse generator included in the intelligent refresh signal generation circuit that is illustrated in FIG. 20.

FIG. 24 is a circuit diagram according to an embodiment of the intelligent refresh signal generator 132_3 that is illustrated in FIG. 20. As illustrated in FIG. 24, the intelligent refresh pulse generator 132_3 may include a first pulse transmission circuit 530, a second pulse transmission circuit 540, a third pulse transmission circuit 550, a buffer circuit 560, and an intelligent reset signal generation circuit 570.

The first pulse transmission circuit 530 may be implemented with inverters 530<1> and 530<2>, NAND gates 530<3> and 530<4>, a NOR gate 530<5>, and an AND gate 530<6>. The first pulse transmission circuit 530 may output an intelligent period signal IOSC as an internal pulse signal IP when a first output control signal OSCEN<1> is enabled at a logic "high" level, and first to fourth intelligent counting signals ICNT<1:4> are counted as a sixth logic level combination. The sixth logic level combination of the first to fourth intelligent counting signals ICNT<1:4> may refer to a case in which the first intelligent counting signal ICNT<1> is counted as a logic "high" level, the second intelligent counting signal ICNT<2> is counted as a logic "high" level, the third intelligent counting signal ICNT<3> is counted as a logic "low" level, and the fourth intelligent counting signal ICNT<4> is counted to a logic "high" level. The first inverted output control signal OSCENB<1>, illustrated in FIG. 24, is a signal that is obtained by inverting the first output control signal OSCEN<1>.

The second pulse transmission circuit 540 may be implemented with inverters 540<1>, 540<2>, and 540<3>, NAND gates 540<4> and 540<5>, a NOR gate 540<6>, and an AND gate 540<7>. The second pulse transmission circuit 540 may output the intelligent period signal IOSC as the internal pulse signal IP when a second output control signal OSCEN<2> is enabled at a logic "high" level, and the first to fourth intelligent counting signals ICNT<1:4> are counted as a seventh logic level combination. The seventh logic level combination of the first to fourth intelligent counting signals ICNT<1:4> may refer to a case in which the first intelligent counting signal ICNT<1> is counted as a logic "low" level, the second intelligent counting signal ICNT<2> is counted as a logic "low" level, the third intelligent counting signal ICNT<3> is counted as a logic "high" level, and the fourth intelligent counting signal ICNT<4> is counted as a logic "high" level. The second inverted output control signal OSCENB<2>, illustrated in FIG. 24, is a signal that is obtained by inverting the second output control signal OSCEN<2>.

The third pulse transmission circuit 550 may be implemented with inverters 550<1> and 550<2>, NAND gates 550<3> and 550<4>, a NOR gate 550<5>, and an AND gate 550<6>. The third pulse transmission circuit 550 may output the intelligent period signal IOSC as the internal pulse signal IP when a third output control signal OSCEN<3> is enabled at a logic "high" level, and the first to fourth intelligent counting signals ICNT<1:4> are counted as an eighth logic level combination. The eighth logic level combination of the first to fourth intelligent counting signals ICNT<1:4> may refer to a case in which the first intelligent counting signal ICNT<1> is counted as a logic "high" level, the second intelligent counting signal ICNT<2> is counted as a logic "low" level, the third intelligent counting signal ICNT<3> is counted as a logic "high" level, and the fourth intelligent counting signal ICNT<4> is counted as a logic "high" level. The third inverted output control signal OSCENB<3>, illustrated in FIG. 24, is a signal that is obtained by inverting the third output control signal OSCEN<3>.

The buffer circuit 560 may be implemented with an inverter 560<1>. The buffer circuit 560 may inversely buffer the internal pulse signal IP to generate an intelligent refresh pulse PSM.

The intelligent reset signal generation circuit 570 may be implemented with an OR gate 570<1>. The intelligent reset signal generation circuit 570 may generate an intelligent reset signal IRST that is enabled at a logic "high" level when one of the intelligent refresh pulse PSM and the reset signal RST is input at a logic "high" level. The intelligent reset signal generation circuit 570 may perform a logical OR operation on the intelligent refresh pulse PSM and the reset signal RST to generate the intelligent rest signal IRST.

Figure 25:
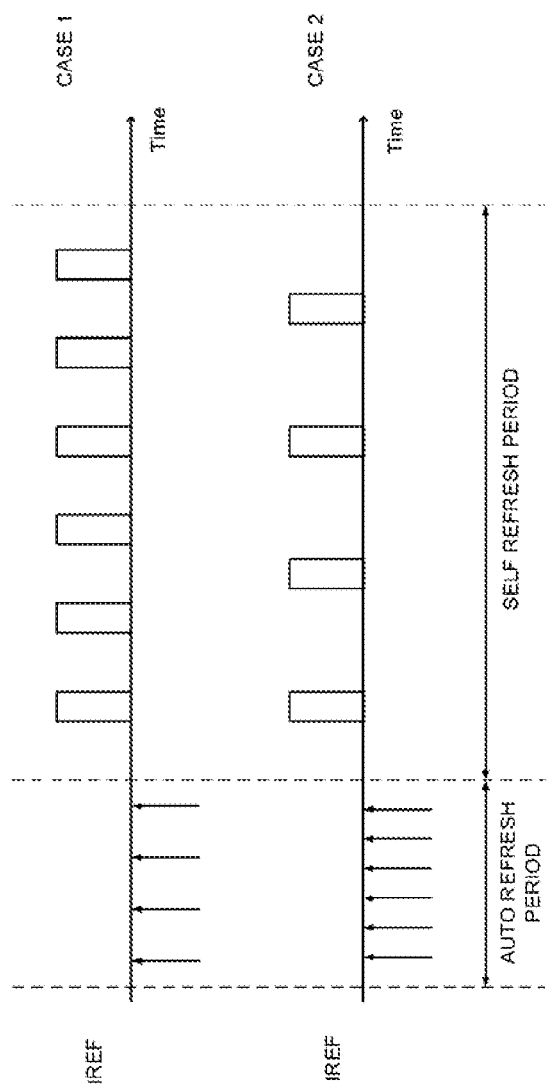
FIG. 25 is a diagram illustrating an intelligent refresh operation of an electronic device according to an embodiment of the present disclosure.

FIG. 25 is a diagram illustrating an intelligent refresh operation of an electronic device 10 according to an embodiment of the present disclosure. The intelligent refresh operation of the electronic device 10 according to an embodiment of the present invention will be described with reference to FIG. 25, but the operation in which the refresh operation period is adjusted based on the number of times an auto refresh signal AREF is input will be described as follows.

First, the case in which the auto refresh signal AREF is 4 times (CASE 1) will be described as follows.

When the auto refresh signal AREF is input 4 times in the auto refresh period AUTO REFRESH PERIOD, an internal refresh signal IREF may be generated 6 times in the self-refresh period SELF REFRESH PERIOD.

That is, during the self-refresh period SELF REFRESH PERIOD, the memory cells MC of the memory circuit (150 of FIG. 1) may be refreshed six times.

Next, the case in which the auto refresh signal AREF is input 6 times (CASE 2) will be described as follows.

When the auto refresh signal AREF is input 6 times in the auto refresh period AUTO REFRESH PERIOD, the internal refresh signal IREF may be generated 4 times in the self-refresh period SELF REFRESH PERIOD.

That is, during the self-refresh period SELF REFRESH PERIOD, the memory cells MC of the memory circuit 150 may be refreshed 4 times.

As described above, the electronic device 10 may perform an intelligent refresh operation that adjusts the operation period of the self-refresh based on the number of times the self-refresh operations and auto refresh operations are periodically performed. The electronic device 10 may perform an efficient refresh operation by performing a constant refresh operation by adjusting the self-refresh operation period based on the number of times the auto refresh signal AREF is input during the intelligent refresh operation. The electronic device 10 may prevent data loss by adjusting the self-refresh operation period based on the number of times the auto-refresh signal AREF is input during the intelligent refresh operation.

Figure 26:
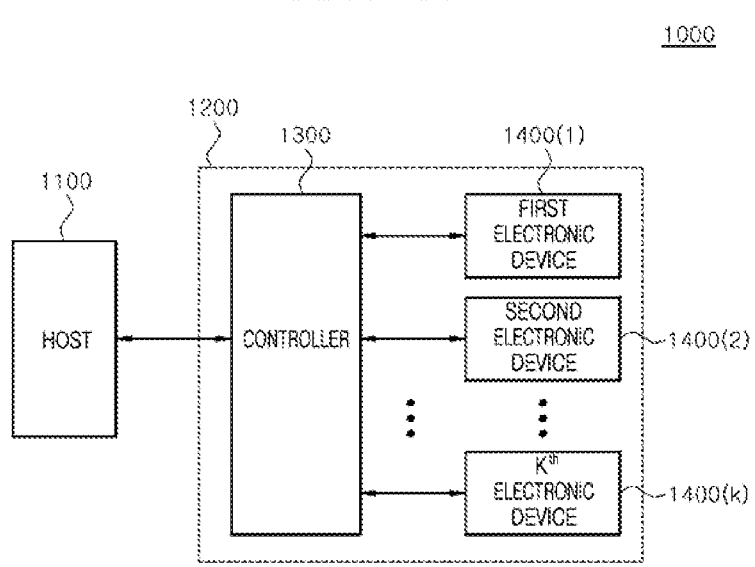
FIG. 26 is a diagram illustrating a configuration according to an embodiment of an electronic system to which the electronic device that is illustrated in FIGS. 1 to 25 is applied.

FIG. 26 is a diagram illustrating a configuration of an electronic system 1000 according to an embodiment of the present disclosure. As illustrated in FIG. 26, the electronic system 1000 may include a host 1100 and a semiconductor system 1200.

The host 1100 and the semiconductor system 1200 may mutually transmit signals using an interface protocol. The interface protocol used between the host 1100 and the semiconductor system 1200 may include multi-media card (MMC), enhanced small disk interface (ESDI), integrated drive electronics (IDE), peripheral component interconnect-express (PCI-E), advanced technology attachment (ATA), serial ATA (SATA), parallel ATA (PATA), serial attached SCSI (SAS), universal serial bus (USB), or the like.

The semiconductor system 1200 may include a controller 1300 and electronic devices 1400(K:1). The controller 1300 may control the electronic devices 1400(K:1) to perform a self-refresh operation and an intelligent refresh operation. Each of the electronic devices 1400(K:1) may perform an intelligent refresh operation that adjusts the operation period of the self-refresh based on the number of times the self-refresh operations and auto-refresh operations are periodically performed. Each of the electronic devices 1400(K:1) may perform an efficient refresh operation by performing a constant refresh operation by adjusting the self-refresh operation period based on the number of times the auto refresh signal AREF is input during the intelligent refresh operation. Each of the electronic devices 1400(K:1) may prevent data loss by adjusting the self-refresh operation period based on the number of inputs of the auto-refresh signal AREF during the intelligent refresh operation.

Each of the electronic devices 1400(K:1) may be implemented with the electronic device 10 that is illustrated in FIG. 1. According to embodiments, the electronic devices 1400(K:1) may be implemented with one of a dynamic random access memory (DRAM), a phase change random access memory (PRAM), a resistive random access memory (RRAM), a magnetic random access memory (MRAM), and a ferroelectric random access memory (FRAM).

Concepts have been disclosed in conjunction with some embodiments as described above. Those skilled in the art will appreciate that various modifications, additions, and substitutions are possible, without departing from the scope and spirit of the present disclosure. Accordingly, the embodiments disclosed in the present specification should be considered from not a restrictive standpoint but rather from an illustrative standpoint. The scope of the concepts is not limited to the above descriptions but defined by the accompanying claims, and all of distinctive features in the equivalent scope should be construed as being included in the concepts.

What is claimed is:

1. An electronic device comprising:
a self-refresh control circuit configured to generate a self-refresh pulse including a pulse periodically generated during a self-refresh operation;
an intelligent refresh control circuit configured to generate an intelligent refresh pulse with a pulse that has a generation period that is adjusted based on the number of generations of an auto refresh signal during an intelligent refresh operation;
an internal refresh signal generation circuit configured to output the self-refresh pulse as an internal refresh signal when an enable signal is disabled during the self-refresh operation,
wherein the internal refresh signal generation circuit is also configured to output the intelligent refresh pulse as the internal refresh signal when the enable signal is enabled during the intelligent refresh operation.

2. The electronic device of claim 1, wherein the intelligent refresh control circuit is configured to generate the intelligent refresh pulse with a generation period that increases as the number of generations of the auto refresh signal increases and a with a generation period that decreases as the number of generations of the auto refresh signal decreases.

3. The electronic device of claim 1, wherein the enable signal is a signal that is enabled when a command to perform the intelligent refresh operation is input.

4. The electronic device of claim 1, wherein the intelligent refresh control circuit includes:
an output control circuit configured to generate first to third output control signals that are selectively enabled based on the number of generations of the auto refresh signal when the enable signal is enabled; and
an intelligent refresh signal generation circuit configured to generate the intelligent refresh pulse with a pulse that has a generation period that is controlled by the first to third output control signals from a time point at which the enable signal is enabled and a self-refresh entry signal is input to a time point at which a self-refresh end signal is input.

5. The electronic device of claim 4, wherein the output control circuit includes:
a sampling control circuit configured to generate a sampling signal and a sampling reset signal that are enabled after a predetermined period from a time point at which the enable signal is enabled; and
a sampling circuit configured to generate the first to third output control signals that are selectively enabled based on the number of times the auto refresh signal is generated when the sampling signal is input.

6. The electronic device of claim 5, wherein the sampling control circuit includes:
a first oscillator configured to generate a sampling period signal with a pulse that is periodically generated during a period in which the enable signal is enabled;
a sampling counter configured to generate a sampling counting signal that is initialized by the sampling reset signal and counted by a pulse of the sampling period signal; and
a sampling pulse generator configured to generate the sampling signal and the sampling reset signal that are enabled when the sampling count signal is counted as a first logic level combination.

7. The electronic device of claim 5, wherein the sampling circuit includes:
an auto refresh counter configured to generate an auto counting signal that is initialized by the sampling reset signal and counted by a pulse of the auto refresh signal; and
an output control signal generation circuit configured to generate the first to third output control signals that are selectively enabled based on the auto counting signal in synchronization with the sampling signal and the intelligent refresh pulse.

8. The electronic device of claim 7, wherein the output control signal generation circuit includes:
a first sensing circuit configured to generate the first output control signal that is enabled when the auto counting signal is counted as a second logic level combination in synchronization with the sampling signal and the intelligent refresh pulse;
a second sensing circuit configured to generate the second output control signal that is enabled when the auto counting signal is counted as a third logic level combination in synchronization with the sampling signal and the intelligent refresh pulse; and
a third sensing circuit configured to generate the third output control signal that is enabled when the auto counting signal is counted as a fourth logic level combination in synchronization with the sampling signal and the intelligent refresh pulse.

9. The electronic device of claim 8, wherein, when the auto counting signal is counted as the third logic level combination, the auto refresh signal is input more times than when the auto counting signal is counted as the second logic level combination, and
wherein, when the auto counting signal is counted as the fourth logic level combination, the auto refresh signal is input more times than when the auto counting signal is counted as the third logic level combination.

10. The electronic device of claim 4, wherein the intelligent refresh signal generation circuit includes:
an intelligent period signal generation circuit configured to generate an intelligent period signal with a pulse that is periodically generated from a time point at which the enable signal is enabled and the self-refresh entry signal is input to a time point at which the self-refresh end signal is input;
an intelligent refresh counter configured to generate an intelligent counting signal that is initialized by an intelligent reset signal and counted by a pulse of the intelligent period signal; and
an intelligent refresh signal generator configured to generate the intelligent refresh pulse and the intelligent reset signal from the intelligent period signal based on a logic level combination of the first to third output control signals and the intelligent counting signal.

11. The electronic device of claim 10, wherein the intelligent period signal generation circuit includes:
an intelligent enable signal generation circuit configured to generate an intelligent enable signal that is enabled from a time point at which the enable signal is enabled and the self-refresh entry signal is input to a time point at which the self-refresh end signal is input; and
a second oscillator configured to generate the intelligent period signal with a pulse that is periodically generated during a period in which the intelligent enable signal is enabled.

12. The electronic device of claim 10, wherein the intelligent refresh signal generator includes:
a first pulse transmission circuit configured to output the intelligent period signal as an internal pulse signal when the first output control signal is enabled and the intelligent counting signal is counted as a fifth logic level combination;

a second pulse transmission circuit configured to output the intelligent period signal as an internal pulse signal when the second output control signal is enabled and the intelligent counting signal is counted as a sixth logic level combination;

a third pulse transmission circuit configured to output the intelligent period signal as an internal pulse signal when the third output control signal is enabled and the intelligent counting signal is counted as a seventh logic level combination;

a buffer circuit configured to buffer the internal pulse signal to generate the intelligent refresh pulse; and an intelligent reset signal generation circuit configured to generate the intelligent reset signal that is enabled when one of a reset signal and the intelligent refresh pulse is enabled.

13. An electronic device comprising:

a self-refresh control circuit configured to generate a self-refresh pulse with a pulse that is periodically generated by a self-refresh entry signal and a self-refresh end signal during a self-refresh operation;

an intelligent refresh control circuit configured to generate an intelligent refresh pulse with a pulse that has a generation period that is adjusted based on the number of generations of an auto refresh signal during an intelligent refresh operation;

an internal refresh signal generation circuit configured to output the self-refresh pulse as an internal refresh signal when an enable signal is disabled during the self-refresh operation, wherein the internal refresh signal generation circuit is also configured to output the intelligent refresh pulse as the internal refresh signal when the enable signal is enabled during the intelligent refresh operation.

14. The electronic device of claim 13, wherein the self-refresh control circuit is configured to generate the self-refresh pulse with a pulse that is periodically generated from a time point at which the self-refresh entry signal is input to a time point at which the self-refresh end signal is input.

15. The electronic device of claim 13, wherein the self-refresh control circuit includes:

a self-period signal generation circuit configured to generate a self-period signal with a pulse that is periodically generated from a time point at which the enable signal is disabled and the self-refresh entry signal is input to a time point at which the self-refresh end signal is input;

a self-refresh counter configured to generate a self-counting signal that is initialized by a self-reset signal and counted by a pulse of the self-period signal; and a self-refresh signal generator configured to generate the self-refresh pulse and the self-reset signal from the self-period signal based on a logic level combination of the self-counting signal when the self-refresh entry signal is enabled.

16. The electronic device of claim 15, wherein the self-period signal generation circuit includes:

a self-enable signal generation circuit configured to generate a self-enable signal that is enabled from a time point at which the enable signal is disabled and the self-refresh entry signal is input to a time point at which the self-refresh end signal is input; and a first oscillator configured to generate the self-period signal with a pulse that is periodically generated during a period in which the self-enable signal is enabled.

17. The electronic device of claim 15, wherein the self-refresh signal generator includes:

a self-period signal transmission circuit configured to generate the self-refresh pulse from the self-period signal when the self-refresh entry signal is disabled and the self-counting signal is counted as a first logic level combination; and a self-reset signal generation circuit configured to generate the self-reset signal that is enabled when one of a reset signal, the self-refresh end signal, and the self-refresh pulse is enabled.

18. The electronic device of claim 13, wherein the intelligent refresh control circuit is configured to generate the intelligent refresh pulse with a generation period that increases as the number of generations of the auto refresh signal increases and a generation period that decreases as the number of generations of the auto refresh signal decreases.

19. The electronic device of claim 13, wherein the intelligent refresh control circuit includes:

an output control circuit configured to generate first to third output control signals that are selectively enabled based on the number of times the auto refresh signal is generated when the enable signal is enabled; and an intelligent refresh signal generation circuit configured to generate the intelligent refresh pulse with a pulse that has a generation period that is adjusted by the first to third output control signals from a time point at which the enable signal is enabled and the self-refresh entry signal is input to a time point at which the self-refresh end signal is input.

20. The electronic device of claim 19, wherein the output control circuit includes:

a sampling control signal configured to generate a sampling signal and a sampling reset signal that are enabled after a predetermined period from a time point at which the enable signal is enabled; and a sampling circuit configured to generate the first to third output control signals that are selectively enabled based on the number of times the auto refresh signal is generated when the sampling signal is input.

21. The electronic device of claim 20, wherein the sampling control circuit includes:

a second oscillator configured to generate a sampling period signal with a pulse that is periodically generated during a period in which the enable signal is enabled;

a sampling counter configured to generate a sampling counting signal that is initialized by the sampling reset signal and counted by a pulse of the sampling period signal; and a sampling pulse generator configured to generate the sampling signal and the sampling reset signal that are enabled when the sampling counting signal is counted as a second logic level combination.

22. The electronic device of claim 20, wherein the sampling circuit includes:

an auto refresh counter configured to generate an auto counting signal that is initialized by the sampling reset signal and counted by a pulse of the auto refresh signal; and an output control signal generation circuit configured to generate the first to third output control signals that are selectively enabled based on the auto counting signal in synchronization with the sampling signal and the intelligent refresh pulse.

23. The electronic device of claim 22, wherein the output control signal generation circuit includes:
- a first sensing circuit configured to generate the first output control signal that is enabled when the auto counting signal is counted as a third logic level combination in synchronization with the sampling signal and the intelligent refresh pulse;
- a second sensing circuit configured to generate the second output control signal that is enabled when the auto counting signal is counted as a fourth logic level combination in synchronization with the sampling signal and the intelligent refresh pulse; and
- a third sensing circuit configured to generate the third output control signal that is enabled when the auto counting signal is counted as a fifth logic level combination in synchronization with the sampling signal and the intelligent refresh pulse.

24. The electronic device of claim 23, wherein, when the auto counting signal is counted as the fourth logic level combination, the auto refresh signal is input more times than when the auto counting signal is counted as the third logic level combination, and
- wherein, when the auto counting signal is counted as the fifth logic level combination, the auto refresh signal is input more times than when the auto counting signal is counted as the fourth logic level combination.

25. The electronic device of claim 19, wherein the intelligent refresh signal generation circuit includes:
- an intelligent period signal generation circuit configured to generate an intelligent period signal with a pulse that is periodically generated from a time point at which the enable signal is enabled and the self-refresh entry signal is input to a time point at which the self-refresh end signal is input;
- an intelligent refresh counter configured to generate an intelligent counting signal that is initialized by an intelligent reset signal and counted by a pulse of the intelligent period signal; and
- an intelligent refresh pulse generator configured to generate the intelligent refresh pulse and the intelligent reset signal from the intelligent period signal based on a logic level combination of the first to third output control signals and the intelligent counting signal.

26. The electronic device of claim 25, wherein the intelligent period signal generation circuit includes:
- an intelligent enable signal generation circuit configured to generate an intelligent enable signal that is enabled from a time point at which the enable signal is enabled and the self-refresh entry signal is input to a time point at which the self-refresh end signal is input; and
- a third oscillator configured to generate the intelligent period signal with a pulse that is periodically generated during a period in which the intelligent enable signal is enabled.

27. The electronic device of claim 25, wherein the intelligent refresh pulse generator includes:
- a first pulse transmission circuit configured to output the intelligent period signal as an internal pulse signal when the first output control signal is enabled and the intelligent counting signal is counted as a sixth logic level combination;
- a second pulse transmission circuit configured to output the intelligent period signal as an internal pulse signal when the second output control signal is enabled and the intelligent counting signal is counted as a seventh logic level combination;
- a third pulse transmission circuit configured to output the intelligent period signal as an internal pulse signal when the third output control signal is enabled and the intelligent counting signal is counted as an eighth logic level combination;
- a buffer circuit configured to buffer the internal pulse signal to generate the intelligent refresh pulse; and
- an intelligent reset signal generating circuit configured to generate the intelligent reset signal that is enabled when one of a reset signal and the intelligent refresh pulse is enabled.

* * * * *